(12) United States Patent
Sato et al.

(10) Patent No.: US 8,809,085 B2
(45) Date of Patent: Aug. 19, 2014

(54) METHOD FOR MANUFACTURING NITRIDE SEMICONDUCTOR DEVICE

(75) Inventors: Taisuke Sato, Kanagawa-ken (JP); Naoharu Sugiyama, Kanagawa-ken (JP); Tomonari Shioda, Kanagawa-ken (JP); Toshiki Hikosaka, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 13/222,238

(22) Filed: Aug. 31, 2011

(65) Prior Publication Data

US 2012/0295377 A1    Nov. 22, 2012

(30) Foreign Application Priority Data

May 16, 2011    (JP) ................... 2011-109782

(51) Int. Cl.
*H01L 33/00* (2010.01)
*H01L 33/22* (2010.01)

(52) U.S. Cl.
USPC ............... 438/29; 438/40; 257/E33.072

(58) Field of Classification Search
USPC ................................................ 438/42
See application file for complete search history.

(56) References Cited

U.S. PATENT DOCUMENTS

| | | | | |
|---|---|---|---|---|
| 6,285,696 | B1* | 9/2001 | Bour et al. | 372/45.01 |
| 7,436,001 | B2* | 10/2008 | Lee et al. | 257/98 |
| 2003/0020087 | A1* | 1/2003 | Goto et al. | 257/103 |
| 2006/0189098 | A1* | 8/2006 | Edmond | 438/460 |
| 2006/0214287 | A1* | 9/2006 | Ogihara et al. | 257/723 |
| 2006/0240585 | A1* | 10/2006 | Epler et al. | 438/22 |
| 2008/0211061 | A1* | 9/2008 | Atwater, Jr. et al. | 257/615 |
| 2009/0212318 | A1* | 8/2009 | Fudeta et al. | 257/99 |
| 2011/0084301 | A1* | 4/2011 | Epler et al. | 257/98 |

FOREIGN PATENT DOCUMENTS

| | | |
|---|---|---|
| JP | 2001-267243 A | 9/2001 |
| JP | 2002-8985 A | 1/2002 |
| JP | 2005-277342 A | 10/2005 |
| JP | 2007-36240 | 2/2007 |
| JP | 2008-53425 | 3/2008 |
| JP | 2008-182110 | 8/2008 |
| JP | 2008-187204 | 8/2008 |
| JP | 2008-227542 | 9/2008 |
| JP | 2008-227546 | 9/2008 |
| JP | 2010-147163 A | 7/2010 |

(Continued)

OTHER PUBLICATIONS

Quirk, M. and Serda, J. Semiconductor Manufacturing Technology NJ, Prentice-Hall, 2001. TK7836.Q27 2001.*

(Continued)

*Primary Examiner* — Charles Garber
*Assistant Examiner* — Alia Sabur
(74) *Attorney, Agent, or Firm* — Oblon, Spivak, McClelland, Maier & Neustadt, L.L.P.

(57) ABSTRACT

According to one embodiment, a method is disclosed for manufacturing a nitride semiconductor device. The method can include removing a growth substrate from a structure body by using a first treatment material. The structure body has the growth substrate, a buffer layer formed on the growth substrate, and the nitride semiconductor layer formed on the buffer layer. A support substrate is bonded to the nitride semiconductor layer. The method can include reducing thicknesses of the buffer layer and the nitride semiconductor layer by using a second treatment material different from the first treatment material after removing the growth substrate.

19 Claims, 18 Drawing Sheets

(56) References Cited

FOREIGN PATENT DOCUMENTS

| JP | 2010-153450 A | 7/2010 |
| JP | 2010-251390 | 11/2010 |
| WO | WO 03/065464 A1 | 8/2003 |

OTHER PUBLICATIONS

Franssila, S. Introduction to Microfabrication NJ, Wiley, 2010. TK7876--.F3 2010eb.*

U.S. Appl. No. 13/601,454, filed Aug. 31, 2012, Sugiyama, et al.
U.S. Appl. No. 13/601,231, filed Aug. 31, 2012, Sato, et al.
Japanese Office Action Issued May 2, 2013 in Patent Application No. 2012-023460 (with English translation).
Japanese Office Action Issued May 2, 2013 in Patent Application No. 2012-023461 (with English translation).
Office Action issued Dec. 8, 2011 in Japan Application No. 2011-109782 (With English Translation).

* cited by examiner

METHOD FOR MANUFACTURING NITRIDE SEMICONDUCTOR DEVICE

CROSS-REFERENCE TO RELATED APPLICATION

This application is based upon and claims the benefit of priority from the prior Japanese Patent Application No. 2011-109782, filed on May 16, 2011; the entire contents of which are incorporated herein by reference.

FIELD

Embodiments described herein relate generally to a method for manufacturing a nitride semiconductor device.

BACKGROUND

As a method for manufacturing a nitride semiconductor device, there is a technique for crystal-growing a nitride semiconductor layer such as gallium nitride (GaN) on a silicon (Si) substrate that is easily processable. When the nitride semiconductor layer is crystal-grown on the Si substrate, the nitride semiconductor layer is crystal-grown through a buffer layer formed on the Si substrate. Further, after the nitride semiconductor layer is crystal-grown, a support substrate is bonded to an opposite side of the Si substrate of the nitride semiconductor layer, and a thin film of the nitride semiconductor layer is formed by removing the Si substrate. In such method for manufacturing the nitride semiconductor device, it is to be desired that a manufacturing yield is further improved.

DETAILED DESCRIPTION

In general, according to one embodiment, a method is disclosed for manufacturing a nitride semiconductor device. The method can include removing a growth substrate from a structure body by using a first treatment material. The structure body has the growth substrate, a buffer layer formed on the growth substrate, and the nitride semiconductor layer formed on the buffer layer. A support substrate is bonded to the nitride semiconductor layer. The method can include reducing thicknesses of the buffer layer and the nitride semiconductor layer by using a second treatment material different from the first treatment material after removing the growth substrate.

In general, according to one other embodiment, a method is disclosed for manufacturing a nitride semiconductor device. The method can include removing a growth substrate from a structure body by using a first treatment material. The structure body includes the growth substrate, a buffer layer and a nitride semiconductor layer. The buffer layer is formed on the growth substrate and includes a first concave-convex shape. The nitride semiconductor layer is formed on the first concave-convex shape. The method can include reducing thicknesses of the buffer layer and the nitride semiconductor layer by using a second treatment material different from the first treatment material after removing the growth substrate, to form a second concave-convex shape reflecting the first concave-convex shape in the nitride semiconductor layer.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

First Embodiment

Figure 1:
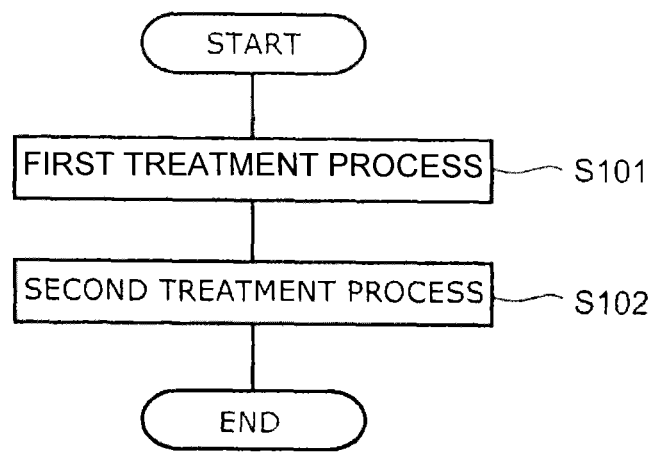
FIG. 1 is a flowchart of a method for manufacturing a nitride semiconductor device according to an embodiment.

FIG. 1 is a flowchart of a method for manufacturing a nitride semiconductor device according to an embodiment.

That is, this method includes a first treatment process (step S101) and a second treatment process (step S102).

In the first treatment process (step S101), a support substrate is bonded to the side of the nitride semiconductor layer of a structure body that has a growth substrate, a buffer layer formed on the growth substrate, and the nitride semiconductor layer formed on the buffer layer, and after that, a process for removing the growth substrate by using a first treatment material is performed.

In the second treatment process (step S102), after the growth substrate is removed by the first treatment process (step S101), a process is performed wherein thicknesses of the buffer layer and the nitride semiconductor layer are reduced by using a second treatment material different from the first treatment material.

Here, the process for reducing the thickness of the layer includes the process for removing the layer in addition to the process for thinning down the thickness of the layer.

That the second treatment material is different from the first treatment material includes either a case where the second treatment material includes a component not included in the first treatment material or a case where the first treatment material includes a component not included in the second treatment material.

The first treatment material, for example, is a gas containing at least one of fluorine and sulfur. The first treatment material is a mixed gas further containing at least one of fluorine and sulfur and at least one of carbon and argon.

The second treatment material is, for example, a gas containing chlorine. The second treatment material is a mixed gas including a gas containing chlorine, and at least one of carbon and argon.

Figure 2:
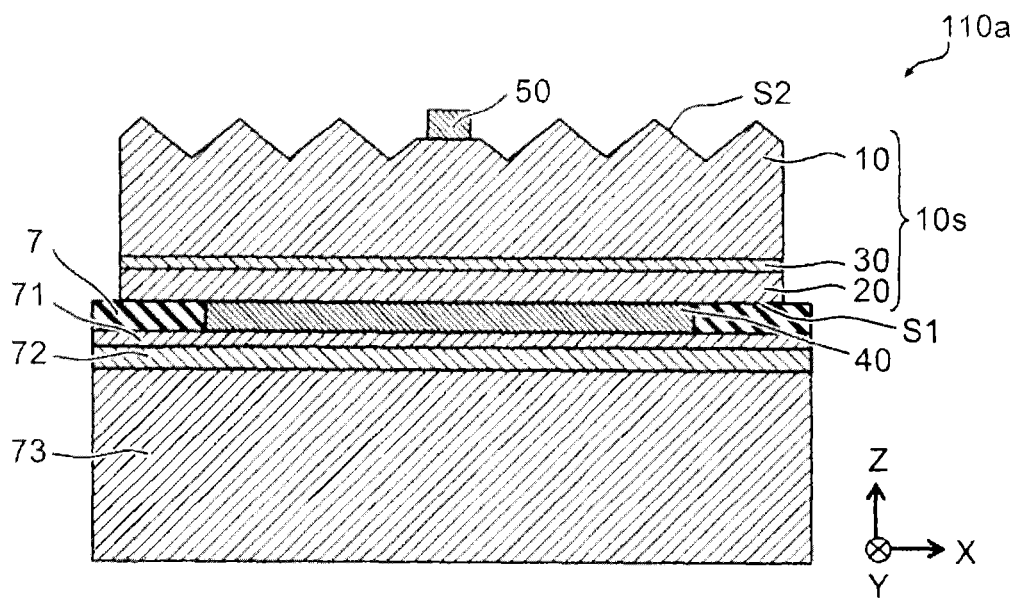
FIG. 2 is a schematic cross-sectional view of the nitride semiconductor device.

FIG. 2 is a schematic cross-sectional view showing one example of the nitride semiconductor device manufactured by a method according to the embodiment.

In FIG. 2 is illustrated a semiconductor light emitting device 110a as one example of the nitride semiconductor device.

As shown in FIG. 2, the semiconductor light emitting device 110a includes an n-type semiconductor layer 10, a p-type semiconductor layer 20, a light emitting layer 30, a p-side electrode 40, and an n-side electrode 50.

The n-type semiconductor layer 10 and the p-type semiconductor layer 20 include a nitride semiconductor. For the n-type semiconductor layer 10, for example, an n-type GaN layer is used. For the p-type semiconductor layer 20, for example, a p-type GaN layer is used.

The light emitting layer 30 is provided between the n-type semiconductor layer 10 and the p-type semiconductor layer 20.

The p-side electrode 40 is provided on a first major surface S1 of the p-type semiconductor layer 20 on the side opposite to the light emitting layer 30. The p-side electrode 40 contacts a part (part of the first major surface S1) of the p-type semiconductor layer 20.

The n-side electrode 50 is provided on a second major surface S2 of the n-type semiconductor layer 10 on the side opposite to the light emitting layer 30. The n-side electrode 50 contacts a part (part of a second major surface S2) of the n-type semiconductor layer 10.

Here, a direction going from the p-type semiconductor layer 20 toward the n-type semiconductor layer 10 is defined as a Z axis direction. An axis perpendicular to the Z axis is defined as an X axis. An axis perpendicular to the Z axis and the X axis is defined as a Y axis. The Z axis direction corresponds to the stacking direction of the n-type semiconductor layer 10, the light emitting layer 30, and the p-type semiconductor layer 20.

Here, in the application specification, the [stacking] includes a case of being directly superposed, but also a case of another component being inserted and superposed in-between.

In a stacked body 10s including the n-type semiconductor layer 10, the light emitting layer 30, and the p-type semiconductor layer 20, the first major surface S1 and the second major surface S2 are the surfaces opposite to each other.

Figure 3:
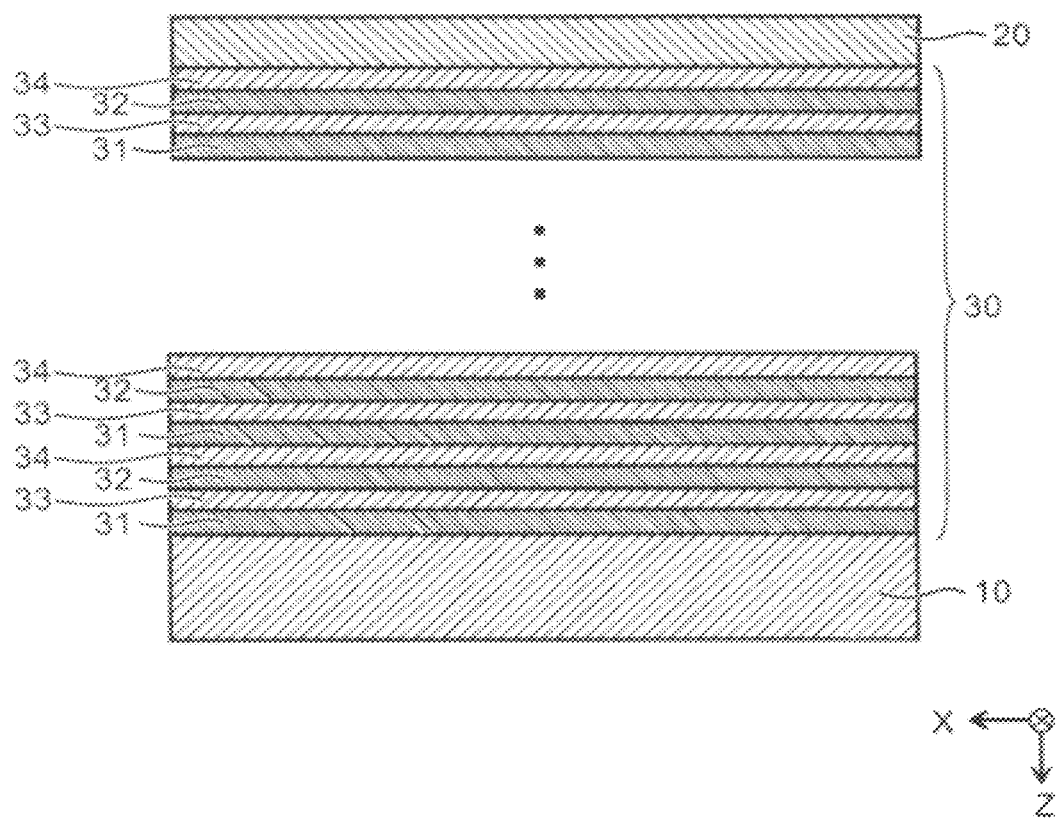
FIG. 3 is a schematic cross-sectional view illustrating a part of the configuration of the nitride semiconductor device.

FIG. 3 is a schematic cross-sectional view illustrating a part of the configuration of a semiconductor light emitting device according to a first embodiment.

FIG. 3 shows an example of the configuration of the light emitting layer 30. The Z direction in FIG. 3 is reversed to the Z direction in FIG. 2.

As shown in FIG. 3, the light emitting layer 30 has a plurality of barrier layers 31, and well layers 32 provided among the plurality of barrier layers 31. The plurality of barrier layers 31 and the plurality of well layers 32 are alternately stacked.

In this example, intermediate layers (n-side intermediate layers 33 and p-side intermediate layers 34) are respectively provided between the barrier layers 31 and the well layers 32.

For example, the barrier layer 31 is provided on the n-type semiconductor layer 10. The n-side intermediate layer 33 is provided on the barrier layer 31. The well layer 32 is provided on the n-side intermediate layer 33. The p-side intermediate layer 34 is provided on the well layer 32. The barrier layer 31, the n-side intermediate layer 33, the well layer 32, and the p-side intermediate layer 34 make one set (period). A plurality of sets is stacked. That is, the light emitting layer 30 may have a multi quantum well (MQW) structure.

Alternatively, the light emitting layer 30 may have a single quantum well (SQW) structure. In this case, the number of sets is one, and the number of well layers 32 is one.

At least one of the n-side intermediate layer 33 and the p-side intermediate layer 34 may be provided or omitted as needed.

For the barrier layer 31, for example, $In_{x2}Al_{y2}Ga_{1-x2-y2}N$ ($0<x2<1$, $0<y2<1$) is used. For the barrier layer 31, for example, $In_{0.02}Al_{0.33}Ga_{0.65}N$ is used. The thickness of the barrier layer 31 is, for example, 11.5 nanometers (nm).

For the n-side intermediate layer 33, for example, $In_{x3}Ga_{1-x3}N$ ($0<x3<1$) is used. For the n-side intermediate layer 33, for example, $In_{0.02}Ga_{0.98}N$ is used. The thickness of the n-side intermediate layer 33 is, for example, 0.5 nm.

For the well layer 32, $In_{x4}Ga_{1-x4}N$ ($0<x4<1$) is used. For the well layer 32, for example, $In_{0.15}Ga_{0.85}N$ is used. The thickness of the well layer 32 is, for example, 2.5 nm.

For the p-side intermediate layer 34, $In_{x5}Ga_{1-x5}N$ ($0<x5<1$) is used. For the p-side intermediate layer 34, for example, $In_{0.02}Ga_{0.98}N$ is used. The thickness of the p-side intermediate layer 34 is, for example, 0.5 nm.

In the embodiment, at least one of the material and the thickness used for the plurality of barrier layers 31 among the plurality of barrier layers 31 may be different from each other in the plurality of barrier layers 31. When the plurality of well layers 32 is provided, at least one of the material and the thickness used for the plurality of well layers 32 may be different from each other in the plurality of well layers 32. When the plurality of n-side intermediate layers 33 is provided, at least one of the material and the thickness used for the plurality of n-side intermediate layers 33 may be different from each other in the plurality of n-side intermediate layers 33. When the plurality of p-side intermediate layers 34 is provided, at least one of the material and the thickness used for the plurality of p-side intermediate layers 34 may be different from each other in the plurality of p-side intermediate layers 34.

When such semiconductor light emitting device 110a is manufactured, the stacked body 10s is, for example, stacked with the n-type semiconductor layer 10, the light emitting layer 30, and the p-type semiconductor layer 20 in this order.

Here, since a sapphire substrate used for the crystal growth of the nitride semiconductor layer is an insulator, a structure of providing the p-side electrode and the n-side electrode on an upper face side of the semiconductor layer (stacked body) is adopted. However, in this structure, serial resistance is high. Moreover, since thermal conductivity of the sapphire substrate is low, there is room for improvement in heat dissipation particularly at high output time.

Hence, there is a configuration (thin film type) wherein the semiconductor layer grown on the sapphire substrate is transferred on a support substrate different from a crystal growth substrate. As the support substrate, since the Si substrate electrically conductive and having high thermal conductivity may be used, it is possible to feed a current in the stacking direction, and obtain low serial resistance and high heat dissipation at the same time.

To fabricate the thin film structure, a laser lift-off technique is used wherein, because the sapphire substrate is chemically stable, a GaN layer is irradiated with high energy UV rays, and is locally heated up to a high temperature, thereby peeling the GaN layer including the light emitting layer from the sapphire substrate.

In the embodiment, the GaN layer is crystal-grown on the Si substrate that is easily processable, and by using this layer, the semiconductor light emitting device 110a is manufactured.

An example of the method for manufacturing the semiconductor light emitting device 110a will be described below.

FIGS. 4A to 8 are schematic cross-sectional views in the order of processes illustrating the method for manufacturing the nitride semiconductor device according to the first embodiment.

Figure 9:
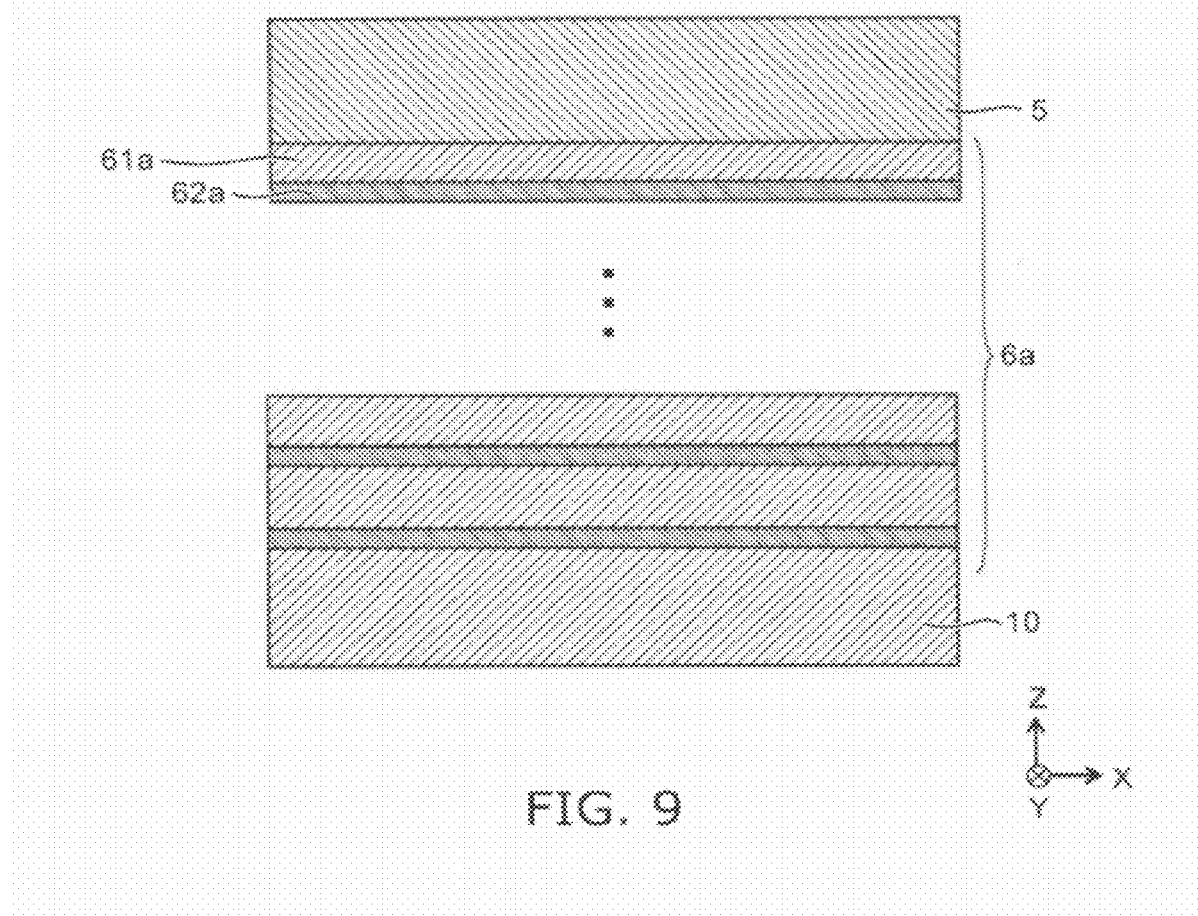
FIG. 9 is a schematic cross-sectional view illustrating one example of the configuration of the buffer layer.

FIG. 9 is a schematic cross-sectional view showing one example of the configuration of the buffer layer.

Figure 4A:
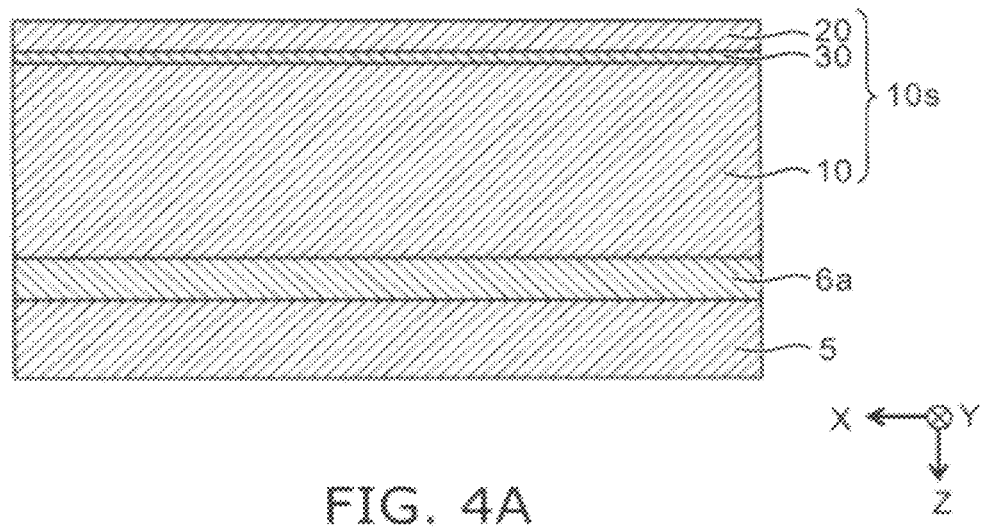
FIGS. 4A to 8 are schematic cross-sectional views illustrating the method for manufacturing the nitride semiconductor device.

As shown in FIG. 4A, a buffer layer 6a is formed on a growth substrate 5. For the growth substrate 5, for example, the Si substrate is used. The growth substrate 5 is, for example, a substrate of a Si single crystal. Further, the growth substrate 5 is a substrate including the Si single crystal layer. For the buffer layer 6a, for example, $In_{x1}Al_{y1}Ga_{1-x1-y1}N$ ($0 \le x1 < 1$, $0 \le y1 < 1$) is used. In one example of the embodiment, the buffer layer 6a is AlN. The thickness of the buffer layer 6s is, for example, 100 nm.

As shown in FIG. 9, the buffer layer 6a may have a stacked structure of a plurality of first buffer layers 61a and a plurality of second buffer layers 62a.

For the first buffer layer 61a, for example, $In_{x6}Al_{y6}Ga_{1-x6-y6}N$ ($0 \le x6 < 1$, $0 \le y6 < 1$) is used. In one example of the embodiment, the first buffer layer 61a is AlN. The thickness of the first buffer layer 61a is, for example, 10 nm.

For the second buffer layer 62a, for example, $In_{x7}Al_{y7}Ga_{1-x7-y7}N$ ($0 \le x7 < 1$, $0 \le y7 < 1$) is used. In the embodiment, the second buffer layer 62a is $Al_{0.75}Ga_{0.25}N$. The thickness of the second buffer layer 62a is, for example, 50 nm.

As shown in FIG. 4A, the n-type semiconductor layer 10, the light emitting layer 30, and the p-type semiconductor layer 20 are formed sequentially on the buffer layer 6a in this order. For the formation of these layers, for example, a metal organic chemical vapor deposition (MOCVD) method is used.

Figure 4B:
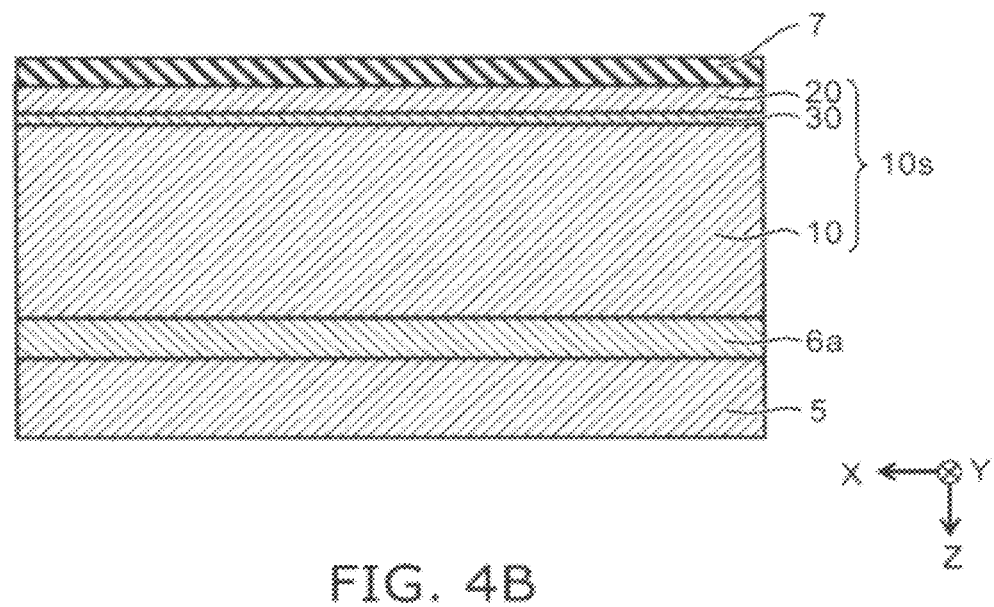

As shown in FIG. 4B, an insulating layer serving as an interlayer insulating layer 7 is formed on the p-type semiconductor layer 20. For the interlayer insulating layer 7, for example, an $SiO_2$ film is used. For the formation of this interlayer insulating layer 7, for example, a thermal CVD method is used.

Figure 5A:
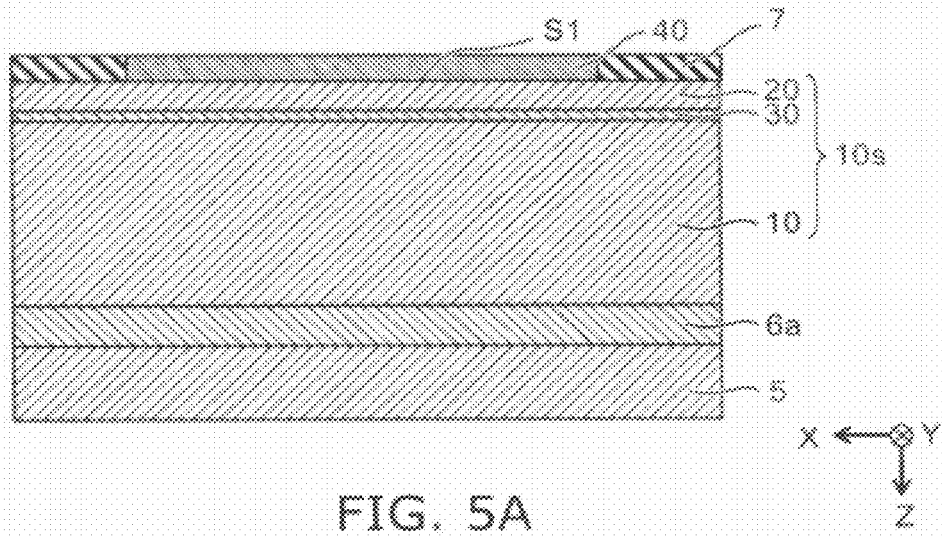

As shown in FIG. 5A, for example, this interlayer insulating layer 7 is processed into a predetermined shape by photolithography and etching, and the p-side electrode 40 is formed by vapor deposition method. For example, the p-side electrode 40 is a metallic film containing at least one element such as Ni, Pt, Ag, Ti, Al, In, Au, etc.

Figure 5B:
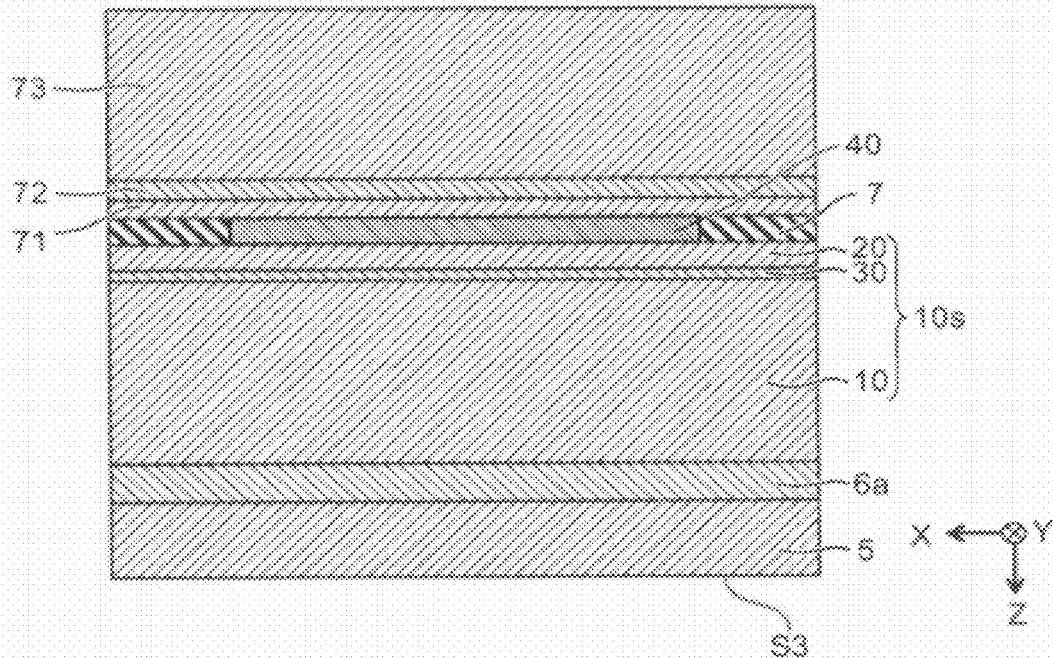

As shown in FIG. 5B, a first bonding layer 71 is formed so as to cover the interlayer insulating layer 7 and the p-side electrode 40. For example, a Ti film, a Pt film, and an Au film are stacked in this order to form the first bonding layer 71.

On the other hand, a second bonding layer 72 is formed on the major surface of a support substrate 73 (for example, Si substrate). For example, an Au—Sn film serving as the second bonding layer 72 is formed on the major surface of the support substrate 73. After that, the first bonding layer 71 and the second bonding layer 72 are brought into contact with each other, and the growth substrate 5 and the support substrate 73 are arranged. In this state, a pressure is applied to both substrates at a high temperature for a predetermined time. One example of the bonding conditions is such that pressurization of one kilo newton (kN) is performed in a state of 280° C. for 30 minutes. As a result, the first bonding layer 71 and the second bonding layer 72 are bonded to each other.

Figure 6A:
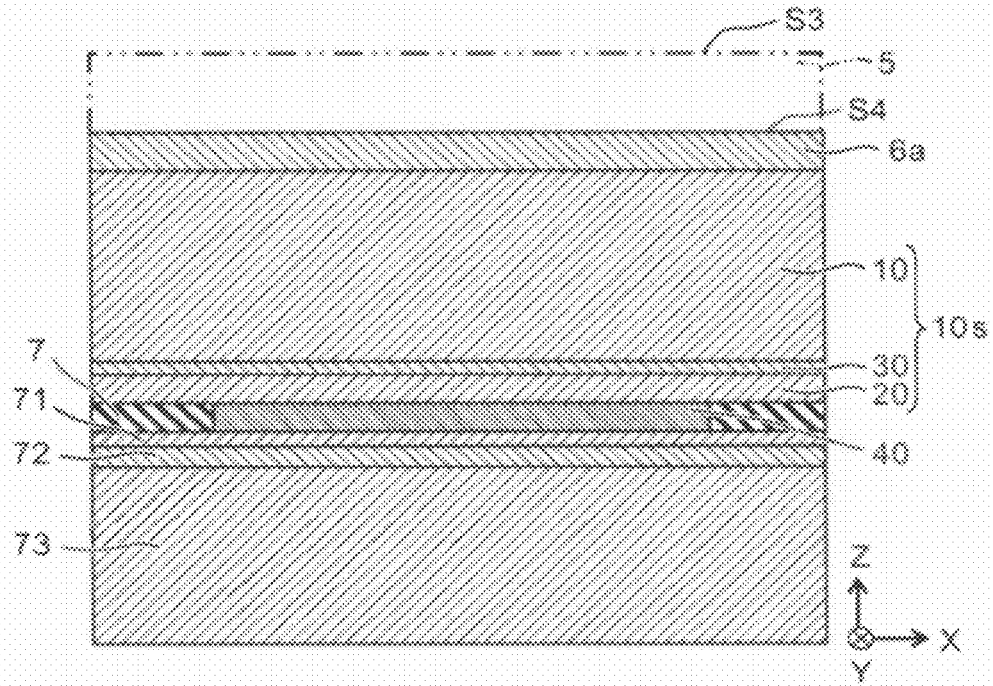

Next, as shown in FIG. 6A, with the growth substrate 5 located on the upside, the Si substrate serving as the growth substrate 5 is removed (first treatment process) by etching by a fluoric reaction gas (first treatment material). Hereinafter, the first treatment process by this etching is referred to as a first etching process. In this first etching process, the AlN layer of the buffer layer 6a is made to serve as an etching stop layer. That is, the first treatment material is quicker in etching rate for the growth substrate 5 than for the buffer layer 6a. This causes a back face S4 of the buffer layer 6a to be exposed. For the etching gas, a fluoric gas such as $C_4F_8$ and $SF_6$ is used, and in this first etching process, no chlorine gas is used. Hence, an etching rate ratio between the Si substrate and the AlN layer of the buffer layer 6a is set to be not less than 100 times.

Due to such large etching rate ratio, even when unevenness (roughness) of a back face S3 of the growth substrate 5 is, for example, about two micrometers (μm), this unevenness is not transferred to the nitride semiconductor layer.

If the etching is performed on the n-type semiconductor layer 10 in a state in which this state of unevenness is not eliminated, the etching advances to the vicinity of the light emitting layer 30 in a wafer face, which may affect the light emitting performance.

Figure 6B:
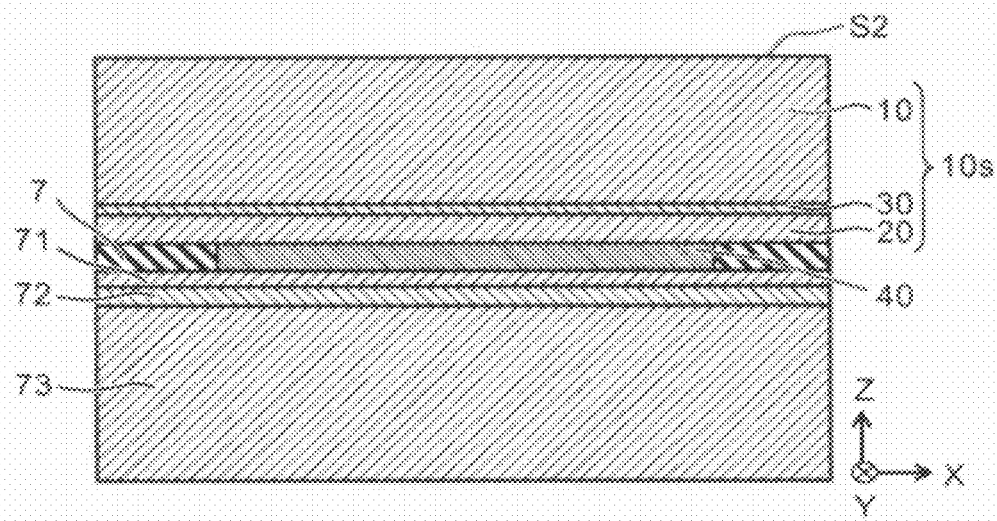

Next, as shown in FIG. 6B, the etching by the chlorine reaction gas (second treatment material) is performed, and the thicknesses of the AlN layer that is the buffer layer 6a and the n-type GaN layer 10 are reduced (second treatment process). Hereinafter, the second treatment process by this etching is referred to as a second etching process. In the embodiment, the buffer layer 6a and a part of the n-type GaN layer 10 are removed by the second etching process. For the etching gas in the second etching process, the chlorine gas such as $Cl_2$ and $BCl_3$ is used. If an AR gas is mixed into the etching gas, an etching rate ratio between the AlN layer and the GaN layer becomes small due to the addition of physical etching also. This makes it much easier to control an etching depth.

As shown in FIG. 6B, when the etching is performed by the second etching process, the second major surface S2 of the n-type semiconductor layer 10 is exposed. The second major surface S2, as to be described later, corresponds to a surface that is finely processed.

Figure 10A:
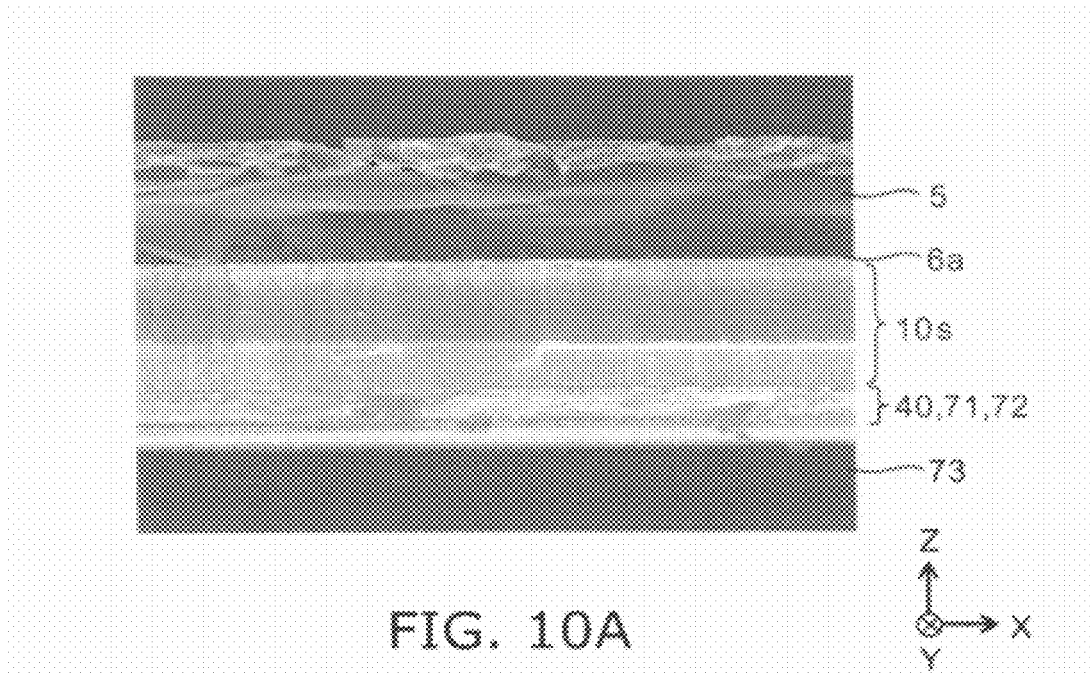
FIGS. 10A to 10B are cross-sectional views illustrating states before and after the first etching process.
Figure 10B:
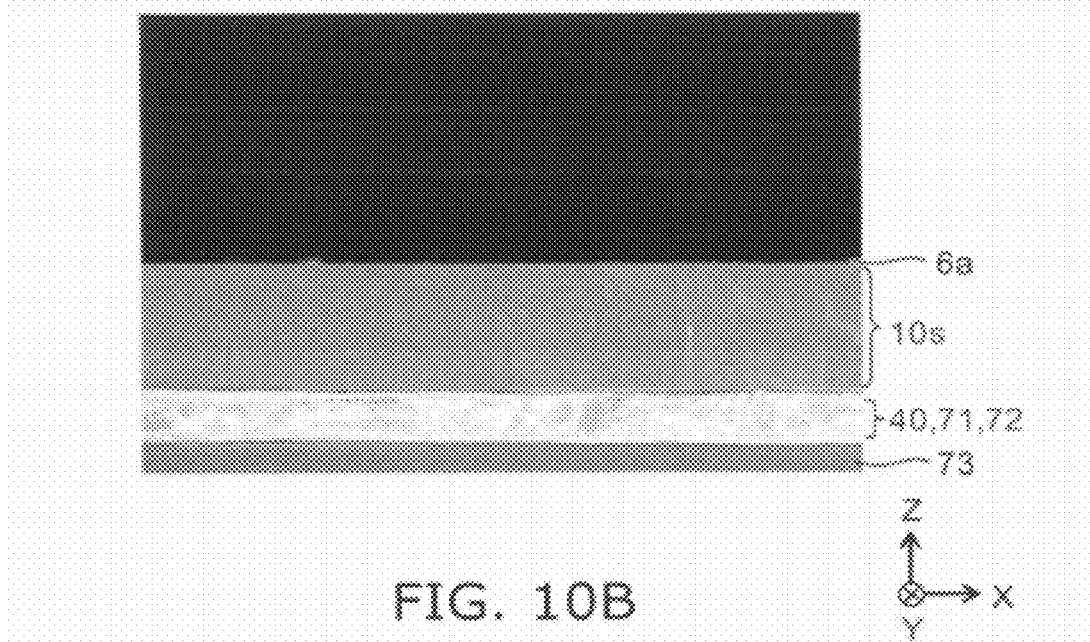

FIGS. 10A to 10B are cross-sectional views illustrating states before and after the first etching process, respectively. FIG. 10A is a view showing a SEM (Scanning Electron Microscope) observation image before the first etching process, and FIG. 10B is a view showing a SEM observation image after the first etching process.

The growth substrate 5 is 625 μm in the initial thickness, but is reduced to about 6 μm by grinding in order to shorten the etching time. As shown in FIG. 10A, it is found that the back face S3 of the growth substrate 5 after this grinding is formed with the roughness of about 2 μm and a crushed layer. Further, as shown in FIG. 10B, it is found that the growth substrate 5 is completely removed by etching in the first etching process. It can be also confirmed that the roughness of the back face S3 of the growth substrate 5 is not transferred completely to the buffer layer 6a.

Here, while the growth substrate 5 is thinned down to about 6 μm before the first etching process is performed, its thickness is preferably made about not less than 10 μm if physical damages to the light emitting layer are considered at the time of thinning down by grinding.

Figure 7A:
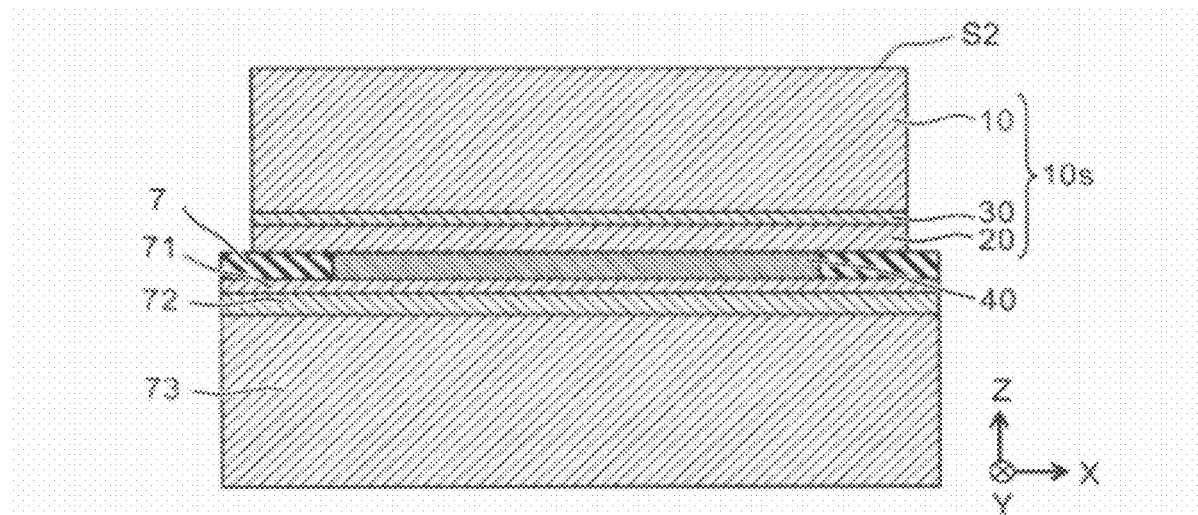

Next, as shown in FIG. 7A, for example, the stacked body 10s is patterned by using a lithography technique, and is divided for each of plural semiconductor light emitting devices. In this patterning, the cross-section of the stacked body 10s is formed into a tapered shape (mesa shape). That is, for example, the width along the X axis of the n-type semiconductor layer 10 is narrower than the width along the X axis of the p-type semiconductor layer 20. Further, for example, the width along the Y axis of the n-type semiconductor layer 10 is narrower than the width along the Y axis of the p-type semiconductor layer 20.

In this patterning, for example, the etching is stopped at the SiO$_2$ film of the interlayer insulating layer 7, and the interlayer insulating layer 7 is exposed.

A protection layer (not shown) is formed so as to cover a side face of the stacked body 10s having a tapered shape. For the protection layer, for example, the SiO$_2$ film is used. Within the SiO$_2$ film, a portion covering the second major surface S2 of the n-type semiconductor layer 10 is removed. At this time, the SiO$_2$ film of a portion along an outer peripheral rim of the second major surface S2 of the n-type semiconductor layer 10 may be left. This allows the portion along the outer peripheral rim of the n-type semiconductor layer 10 to be protected by the protection layer.

Figure 7B:
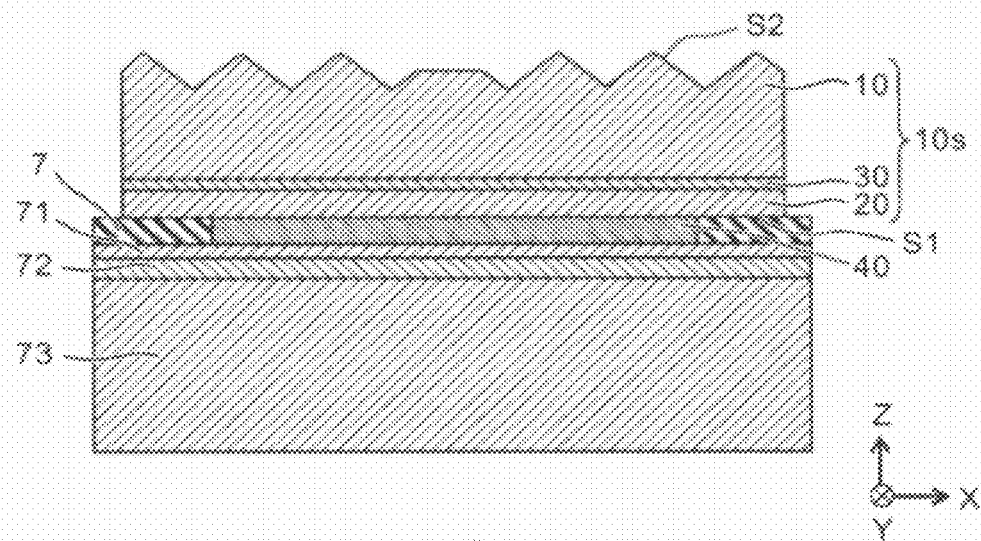

Further, at this time, for example, unevenness may be formed on the surface of the exposed n-type semiconductor layer 10 by etching using potassium hydroxide. For example, the etching is performed for 15 minutes by using potassium hydroxide having the temperature of 70° C. at the concentration of 1 mol/l. By such wet etching, the second major surface S2 of the n-type semiconductor layer 10 is made into a rough surface. In the second major surface S2, the n-type semiconductor layer 10 has a surface roughness of about not less than 100 nm and about not more than 3000 nm. This realizes the structure as illustrated in FIG. 7B.

Figure 8:
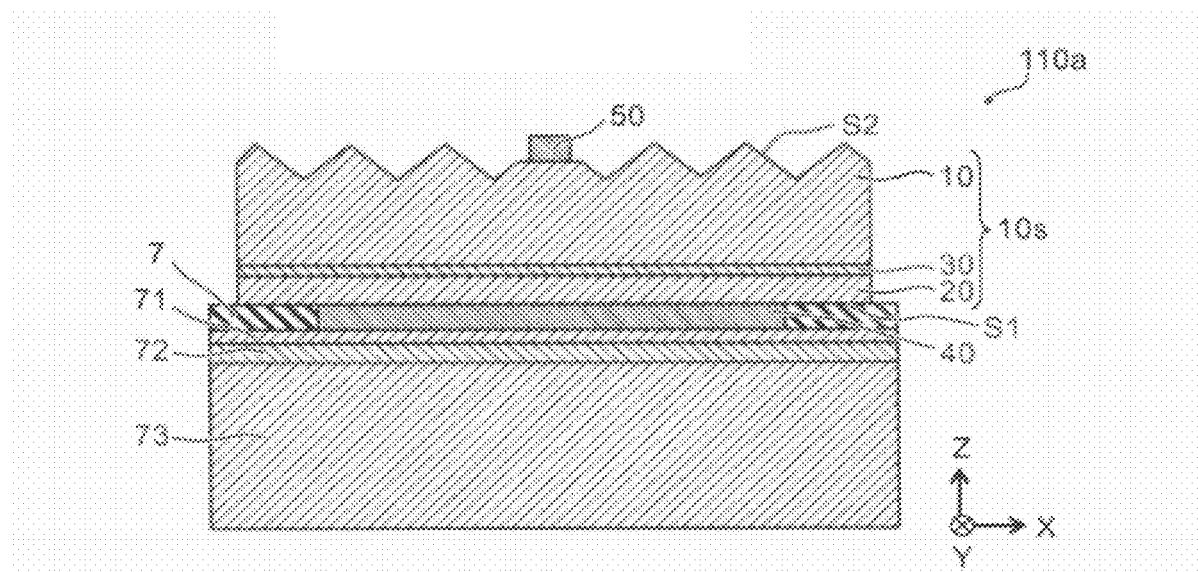

As shown in FIG. 8, a portion except for the center of the second major surface S2 of the n-type semiconductor layer 10 is formed with the n-side electrode 50. For example, as the n-side electrode 50, a metallic film such as Ti, Al, Rh, In, Ni, Pt and Au is formed, and is processed into a predetermined shape.

In this manner, the n-side electrode 50 contains, for example, at least one element selected from the group consisting of Ti, Al, Rh, In, Ni, Pt, and Au.

With two stages of the first etching process and the second etching process performed similarly to the embodiment, it is possible to suppress the damages to the light emitting layer 30 at the time of removing the growth substrate 5. Further, due to excellent smoothness within a wafer face in the etching surface of the n-type semiconductor layer 10, it is possible to enhance substantially the manufacturing yield of the semiconductor light emitting device 110a.

In the first embodiment, while the device isolation process shown in FIG. 7A is performed after the first etching process and the second etching process, for example, the device isolation process may be performed before and after the process as shown in FIG. 4A or before and after the first etching process as shown in FIG. 6A. In that case, a layer for protecting the damages to an active layer due to an etching gas is provided as appropriate.

Second Embodiment

Figure 11:
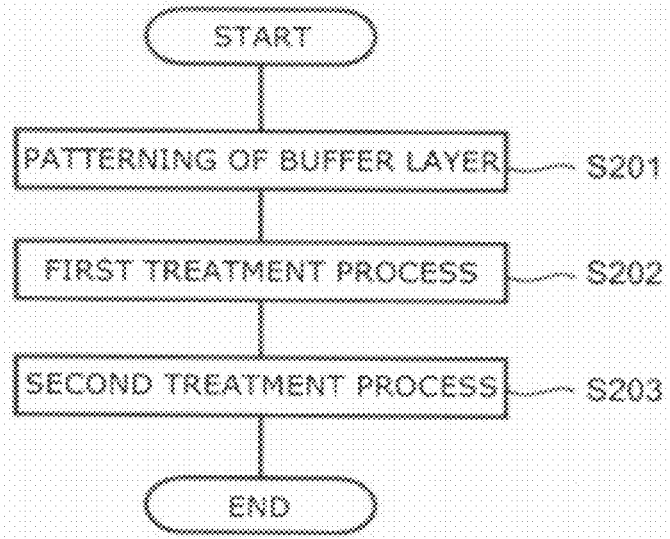
FIG. 11 is a flowchart of a method for manufacturing a nitride semiconductor device according to an embodiment.

FIG. 11 is a flowchart of a method for manufacturing a nitride semiconductor device according to an embodiment.

That is, this method includes patterning (step S201) of a buffer layer, a first treatment process (step S202), and a second treatment process (S203).

In the patterning (step S201) of the buffer layer, a process is performed wherein the buffer layer formed on a growth substrate is patterned to form a first concave-convex shape.

In the first treatment process (step S202), a process is performed wherein a support substrate is bonded to the side of a nitride semiconductor layer of a structure body that has the growth substrate, the buffer layer formed on the growth substrate and including the first concave-convex shape, and the nitride semiconductor layer formed on the first concave-convex shape of the buffer layer, and after that, the growth substrate is removed by using a first treatment material.

In the second treatment process (step S203), a process is performed wherein after the growth substrate is removed by the first treatment process (step S202), the thicknesses of the buffer layer and the nitride semiconductor layer are reduced by using a second treatment material different from the first treatment material, and a second concave-convex shape reflecting the first concave-convex shape is formed on the nitride semiconductor layer.

Figure 12:
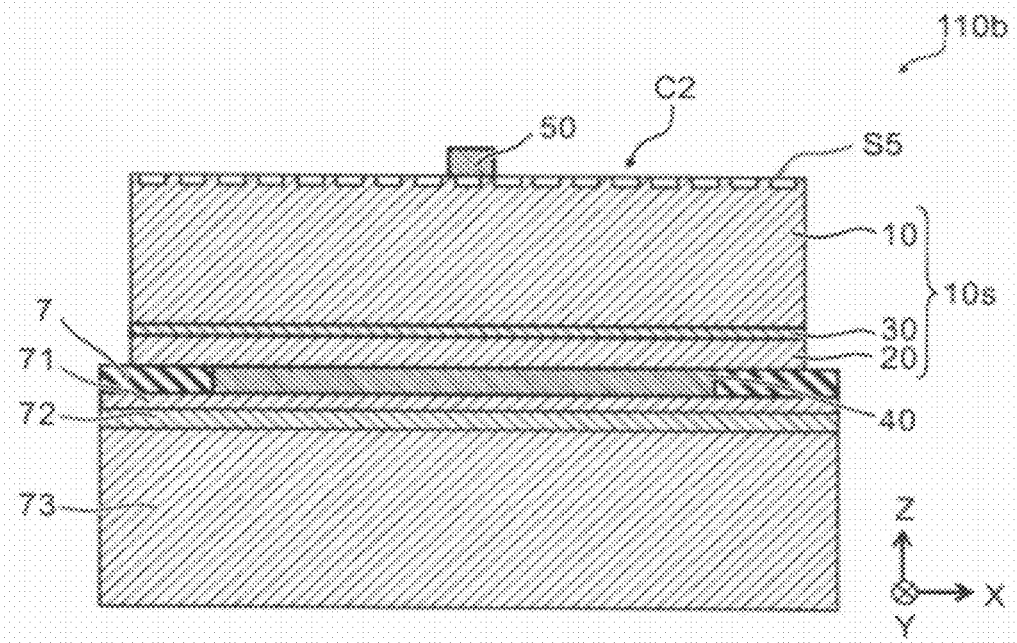
FIG. 12 is a schematic cross-sectional view of the nitride semiconductor device.

FIG. 12 is a schematic cross-sectional view showing one example of the nitride semiconductor device manufactured by a method according to the embodiment.

In FIG. 12 is illustrated a semiconductor light emitting device 110b as one example of the nitride semiconductor device.

As shown in FIG. 12, the semiconductor light emitting device 110b includes an n-type semiconductor layer 10, a p-type semiconductor layer 20, a light emitting layer 30, a p-side electrode 40, and an n-side electrode 50.

In the semiconductor light emitting device 110b, a fine concave-convex shape (second concave-convex shape C2) is provided on a major surface S5 of the n-type semiconductor layer 10.

An example of the method for manufacturing the semiconductor light emitting device 110b will be described below.

FIGS. 13A to 16B are schematic cross sectional views in the order of processes illustrating the method for manufacturing the nitride semiconductor device according to the second embodiment.

FIGS. 17 to 21 are enlarged schematic cross-sectional views illustrating the method.

Figure 13A:
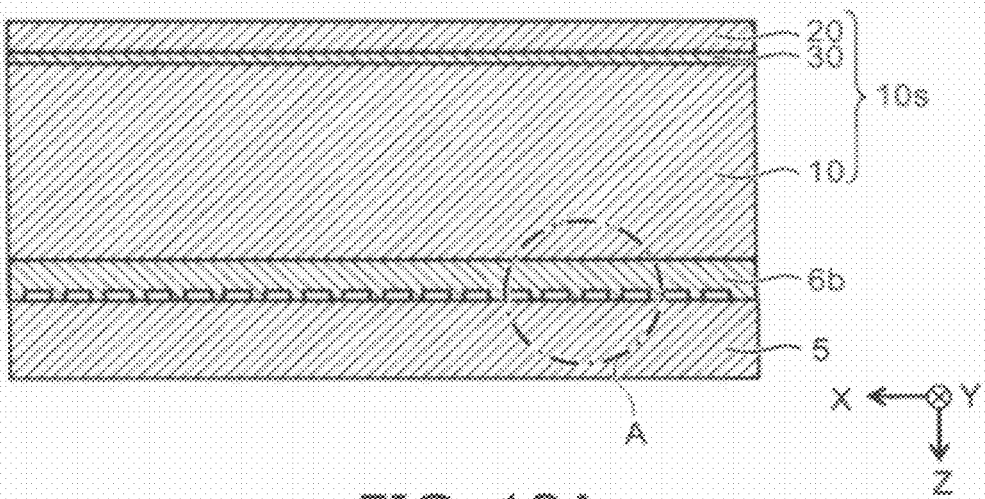
FIGS. 13A to 16B are schematic cross sectional views illustrating the method for manufacturing the nitride semiconductor device.
Figure 17:
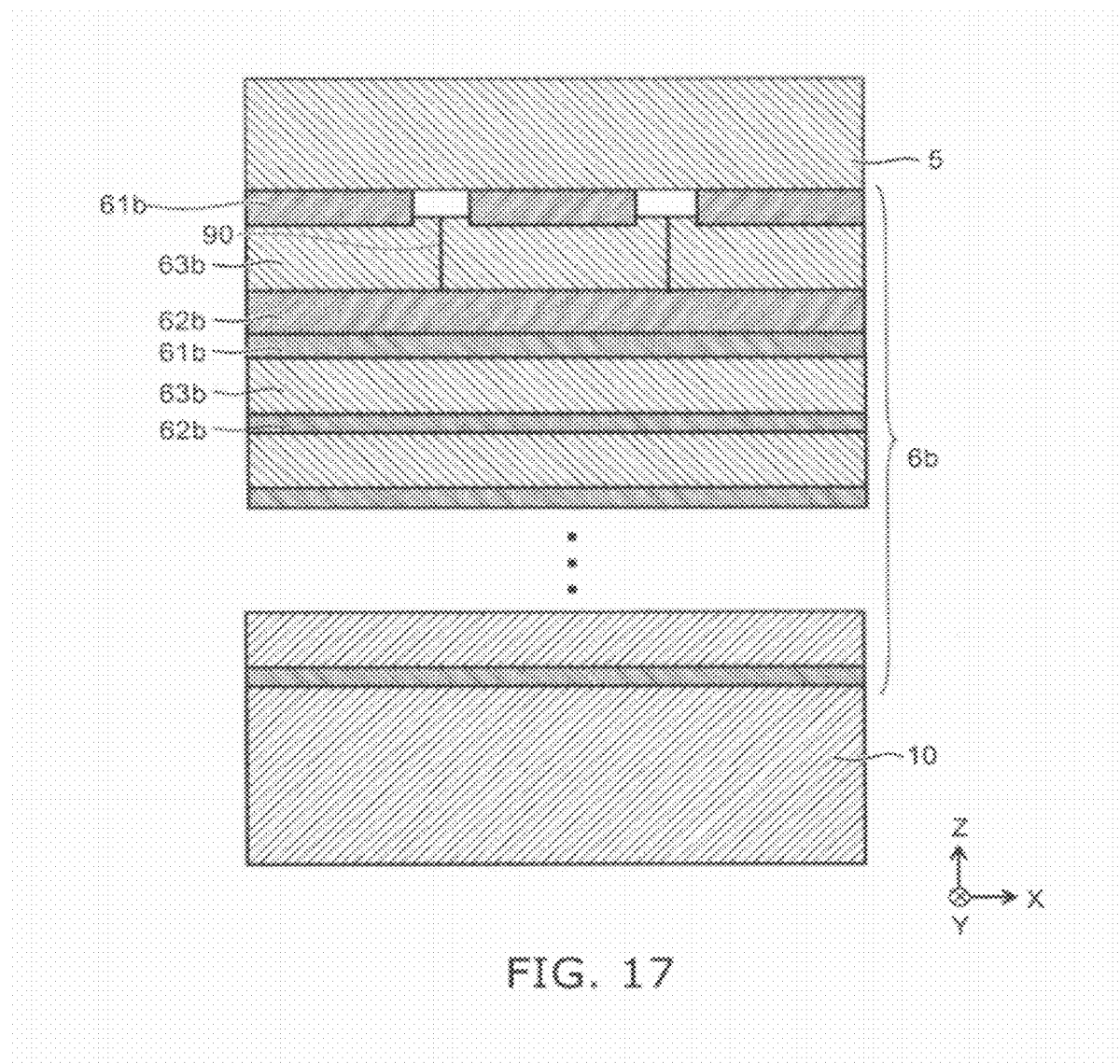
FIGS. 17 to 21 are enlarged schematic cross-sectional views illustrating the method.

FIG. 17 shows an enlarged schematic cross-sectional view of a portion A shown in FIG. 13A. In FIG. 17, the Z axis direction of FIG. 13A is shown reversed.

Figure 15A:
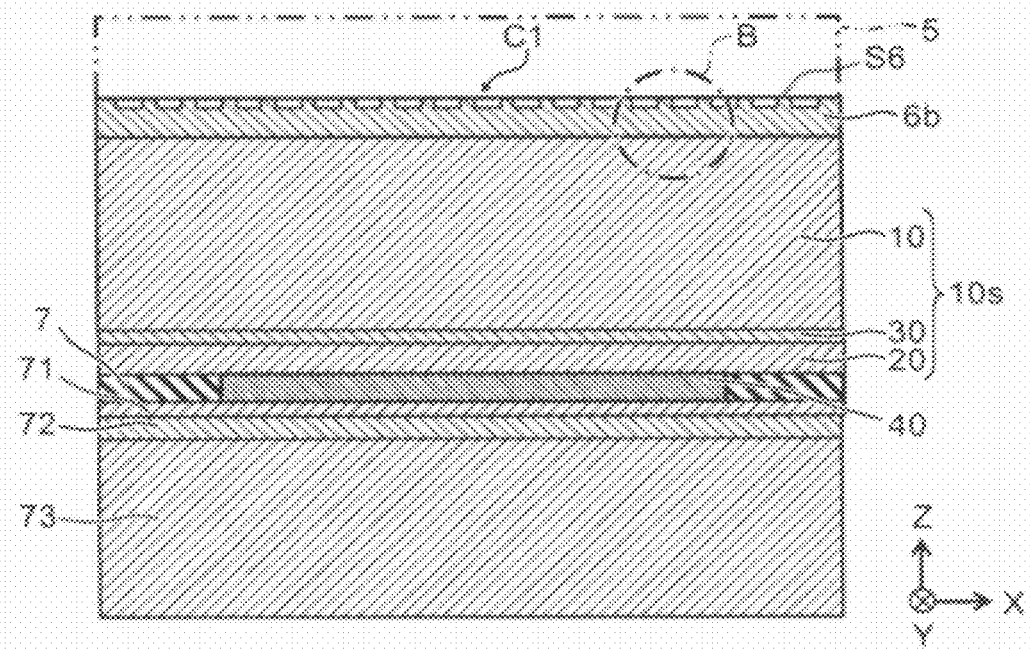
Figure 18:
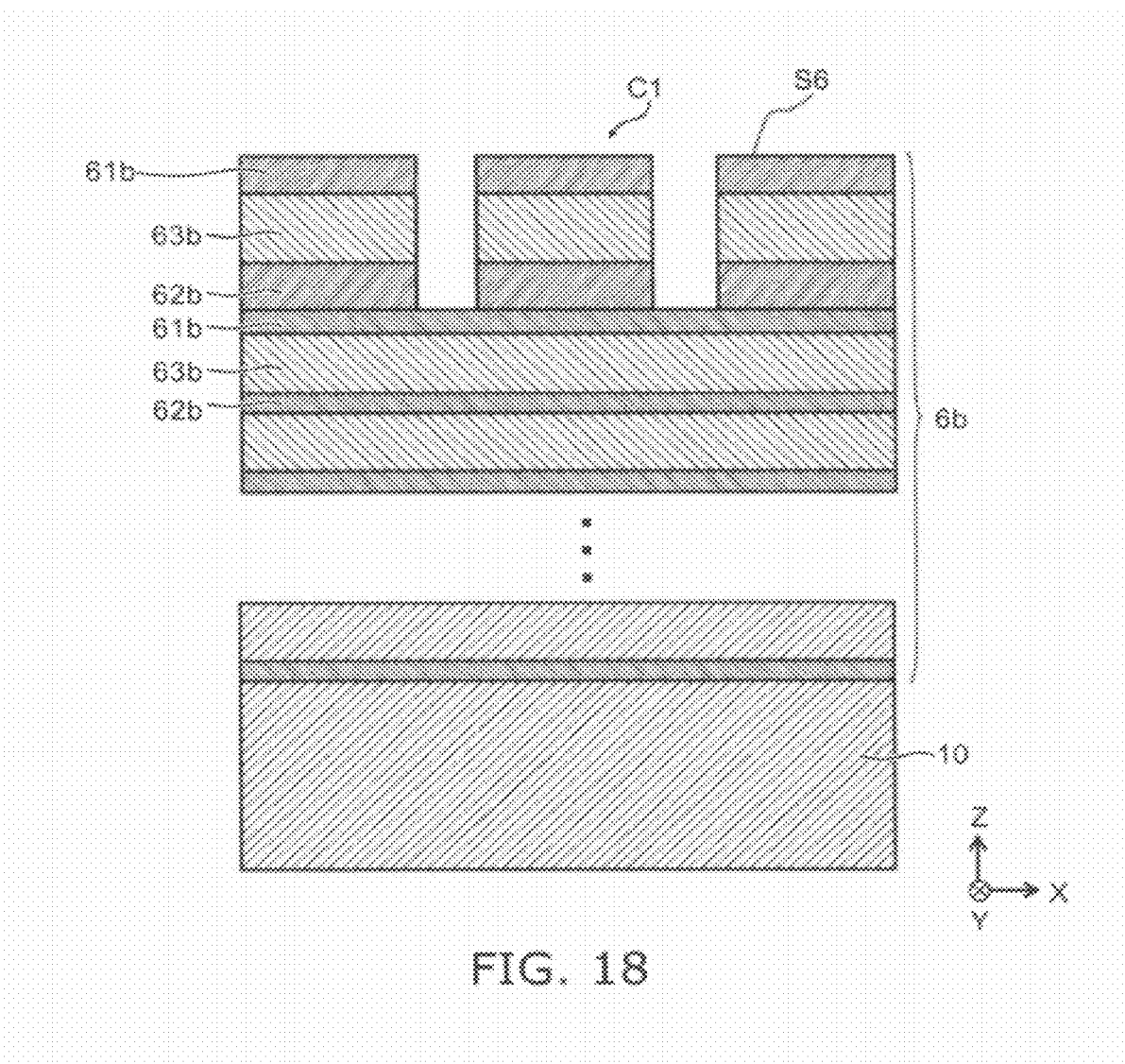
Figure 19:
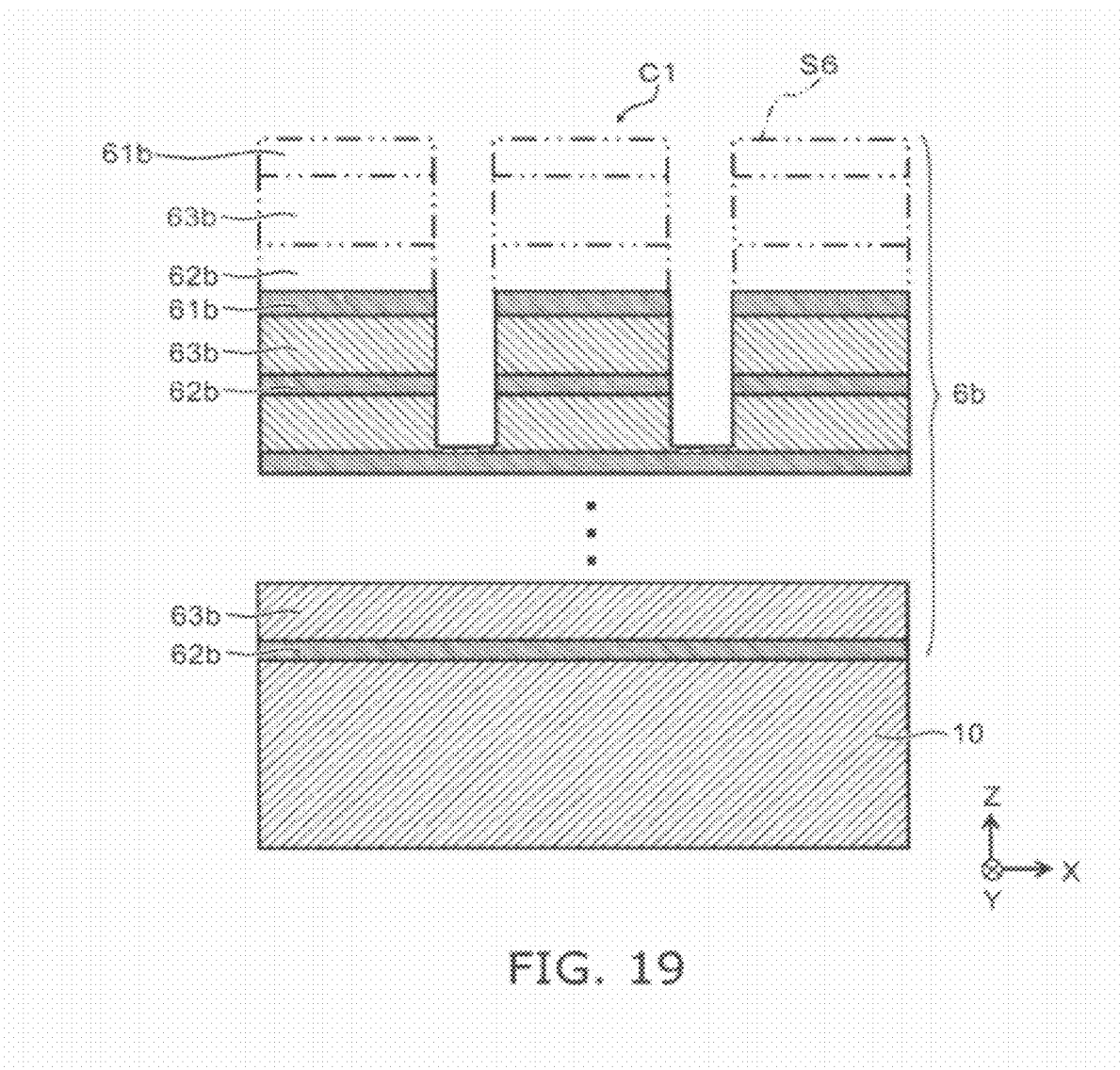
Figure 20:
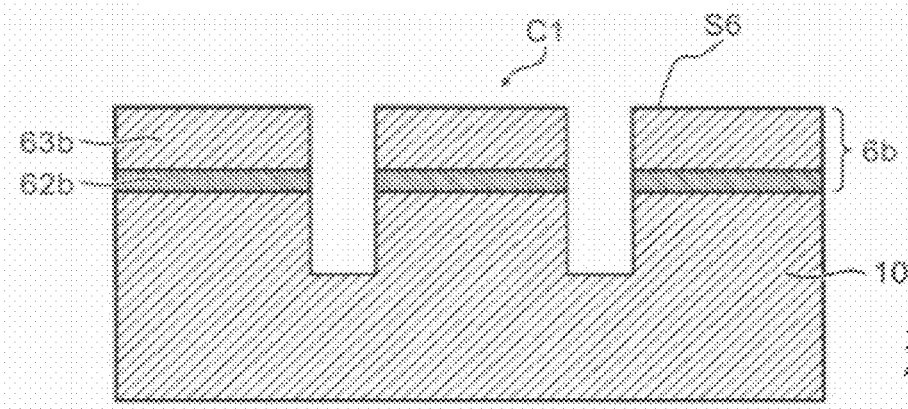

FIGS. 18 to 20 show an enlargement of a portion B shown in FIG. 15A.

Figure 15B:
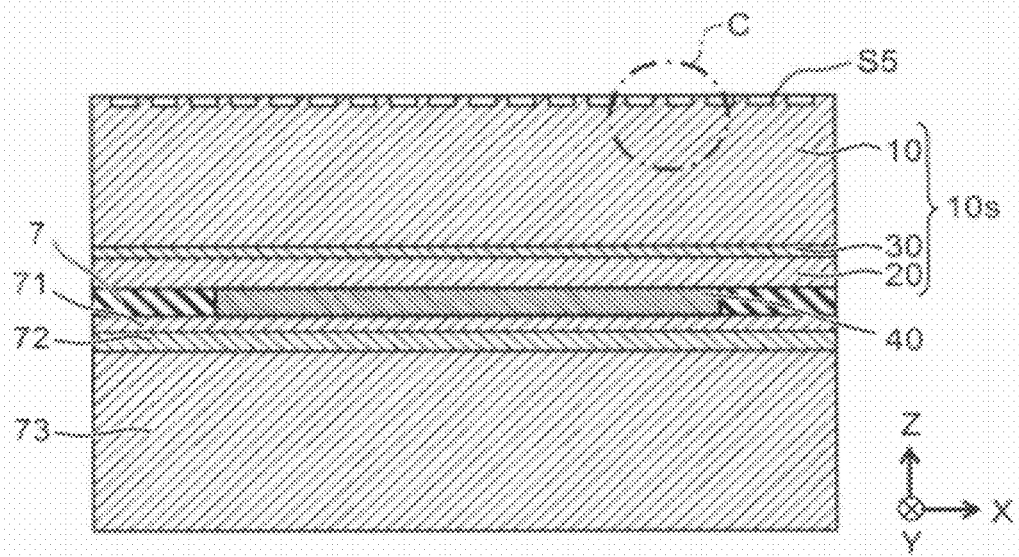
Figure 21:
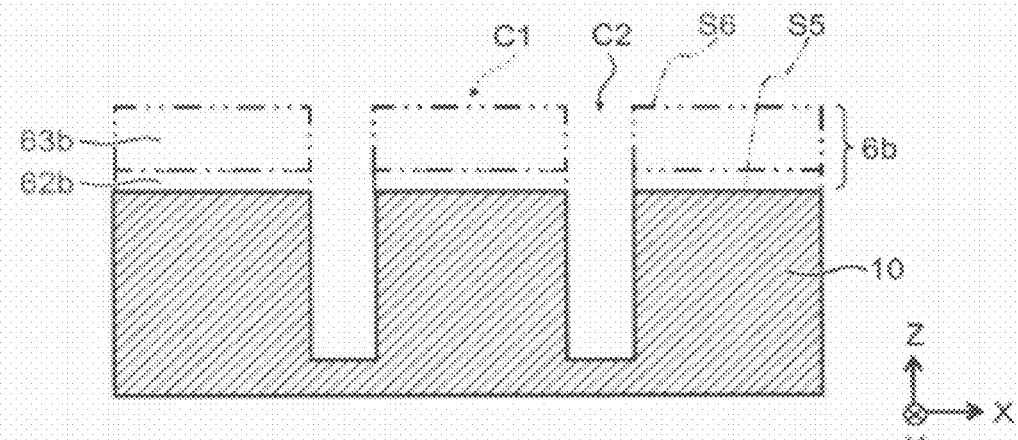

FIG. 21 shows an enlargement of a portion C shown in FIG. 15B.

As shown in FIG. 13A, a buffer layer 6b is formed on the growth substrate 5, and a stacked body 10s is crystal-grown on the buffer layer 6b. For the growth substrate 5, for example, a Si substrate is used.

The buffer layer 6b shown in FIG. 17 is, for example, formed by metal organic chemical vapor deposition (MOCVD) method.

One example of a specific fabrication method of the buffer layer 6b is as follows.

First, a first buffer layer 61b is formed in the growth substrate 5, and for example, the first buffer layer 61b is patterned by using a lithographic technique, and is divided into a plurality of regions. In this patterning, a width along an X axis of the first buffer layer 61b is about 3 μm, and a distance along the X axis between adjacent first buffer layers 61b is about 2 μm.

Next, the stacking of third buffer layers 63b is performed. At this time, as described above, since the first buffer layer 61b is patterned, the third buffer layer 63b is crystal-grown only from an interface part with the first buffer layer 61b. A coalescence part 90 wherein facets of adjacent third buffer layers 63b coalesce with each other is formed in the vicinity of the center of a groove part wherein the first buffer layer 61b is patterned. After that, the second buffer layers 62b and the first buffer layers 61b are stacked in this order.

As shown in FIG. 17, the buffer layer 6b may have a stacked structure wherein several periods each including the first buffer layer 61b, the second buffer layer 62b, and the third buffer layer 63b are repeated.

For the first buffer layer 61b, for example, $In_{x8}Al_{y8}Ga_{1-x8-y8}N$ (0<x8<1, 0<y8<1) is used. In one example of the embodiment, the first buffer layer 61b is AlN. The thickness of the first buffer layer 61b is, for example, 10 nm.

For the second buffer layer 62b, for example, $In_{x9}Al_{y9}Ga_{1-x9-y9}N$ (0<x9<1, 0<y9<1) is used. In one example of the embodiment, the second buffer layer 62b is $Al_{0.75}Ga_{0.25}N$. The thickness of the second buffer layer 62b is, for example, 50 nm.

For the third buffer layer 63b, for example, $In_{x10}Al_{y10}Ga_{1-x10-y10}N$ (0<x10<1, 0<y10<1) is used. In one example of the embodiment, the third buffer layer 63b is GaN. The thickness of the third buffer layer 63b is, for example, 2 μm.

Figure 13B:
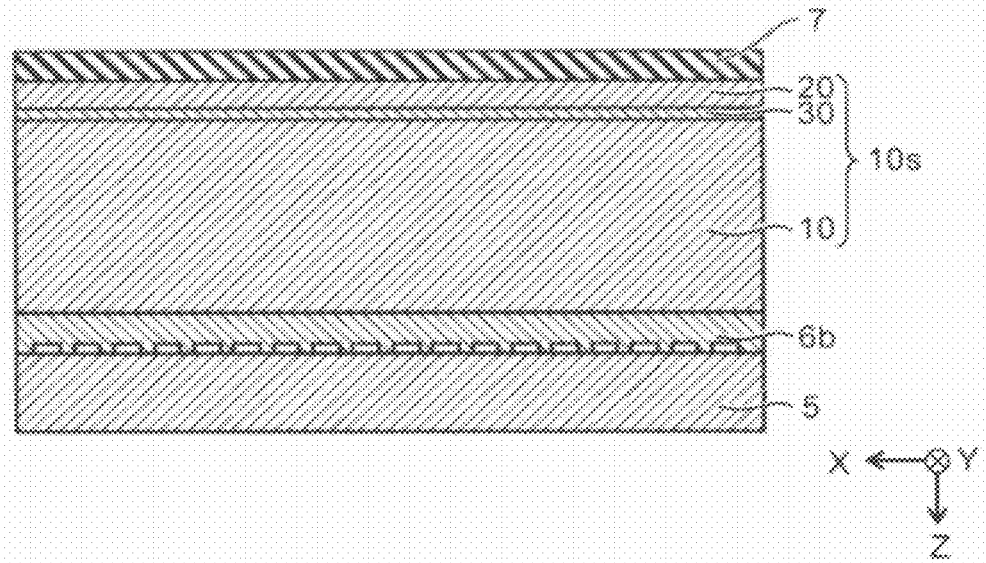

After an epitaxial wafer including the buffer layer 6b is formed, as shown in FIG. 13B, an insulating layer serving as an interlayer insulating layer 7 is formed on the p-type semiconductor layer 20. For the interlayer insulating layer 7, for example, an $SiO_2$ film is used. For the formation of this interlayer insulating layer 7, for example, a thermal CVD method is used.

Figure 14A:
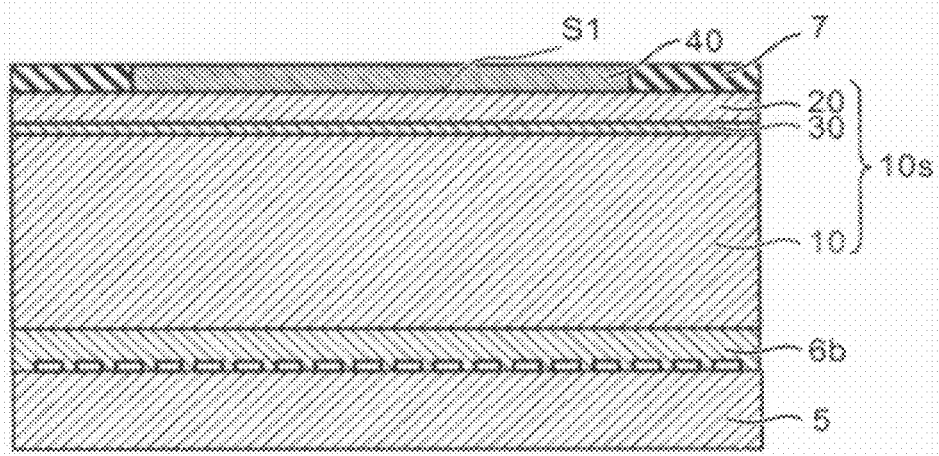

As shown in FIG. 14A, for example, this interlayer insulating layer 7 is processed into a predetermined shape by photolithography and etching, and a p-side electrode 40 is formed by vapor deposition method. For example, the p-side electrode 40 is a metallic film containing at least one element such as Ni, Pt, Ag, Ti, Al, In, Au, etc.

Figure 14B:
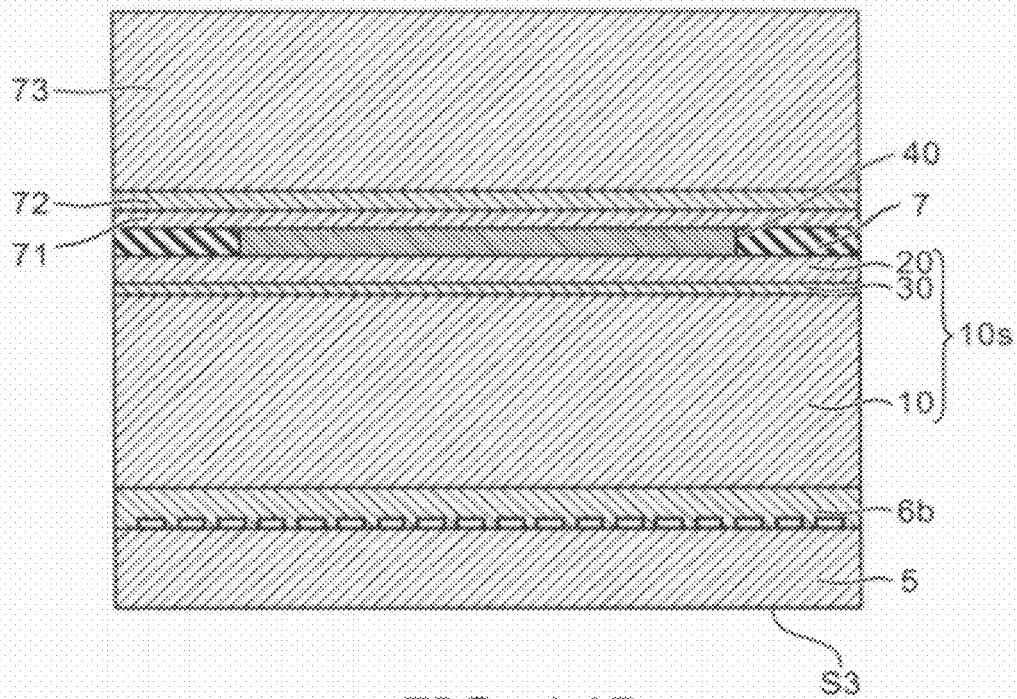

As shown in FIG. 14B, a first bonding layer 71 is formed so as to cover the interlayer insulating layer 7 and the p-side electrode 40. For example, a Ti film, a Pt film, and an Au film are stacked in this order to form the first bonding layer 71.

On the other hand, a second bonding layer 72 is formed on the major surface of a support substrate 73 (for example, Si substrate). For example, an Au—Sn film serving as the second bonding layer 72 is formed on the major surface of the support substrate 73. After that, the first bonding layer 71 and the second bonding layer 72 are brought into contact with each other, and the growth substrate 5 and the support substrate 73 are arranged. In this state, a pressure is applied to both substrates at a high temperature for a predetermined time. One example of the bonding conditions is such that pressurization of one kilo newton (kN) is performed in a state of 280° C. for 30 minutes. As a result, the first bonding layer 71 and the second bonding layer 72 are bonded to each other.

Next, the removal of the growth substrate 5 is performed. That is, in the structure of the buffer layer 6b shown in FIG. 17, with the growth substrate 5 located on the upside, the Si substrate is removed in the first etching by fluoric reaction gas. This causes the AlN layer of the buffer layer 61b to become an etching stop layer, thereby forming a fine concave-convex shape (first concave-convex shape C1) shown in FIG. 18. For the etching gas, a fluorine gas such as $C_4F_8$ and $SF_6$ is used, and in this first etching process, no chlorine gas is used. As a result, as shown in FIG. 15A, an upper face S6 of the buffer layer 6b having the fine concave-convex shape (first concave-convex shape C1) is formed.

Next, as shown in FIG. 15B, the second etching process by chlorine reaction gas is performed, and the buffer layer 6b and a part of the n-type semiconductor layer 10 are removed. For an etching gas, a chlorine gas such as $Cl_2$ and $BCl_3$ is used. When an Ar gas is mixed into the etching gas, an etching rate ratio between the AlN layer and the GaN layer is reduced due to the addition of physical etching, and this makes it much easier to control an etching depth.

As a result, the fine first concave-convex shape C1 formed on the upper face S6 of the buffer layer 6b is transferred to the major surface S5 of the n-type semiconductor layer 10.

Here, a state in which the first concave-convex shape is transferred will be described according to FIGS. 18 to 21.

As shown in FIG. 18, when the second etching process is performed in a state in which the first concave-convex shape C1 is formed on the upper face S6 of the buffer layer 6b, the etching of the buffer layer 6b progresses while the first concave-convex shape C1 remains as it is (see FIGS. 18 to 19). A recess part of the first concave-convex shape C1 reaches the n-type semiconductor layer 10 earlier than a protrusion part (see FIG. 20), and the etching further progresses.

When the buffer layer 6b is entirely removed, as shown in FIG. 21, the major surface S5 of the n-type semiconductor layer 10 is formed with a second concave-convex shape C2 reflecting the first concave-convex shape C1. When an etching rate of the buffer layer 6b and an etching rate of the n-type semiconductor layer 10 are equal to each other, the first concave-convex shape C1 and the second concave-convex shape C2 become equal to each other. On the other hand, a difference is generated between the first concave-convex shape C1 and the second concave-convex shape C2 according to a difference between these etching rates.

Figure 16A:
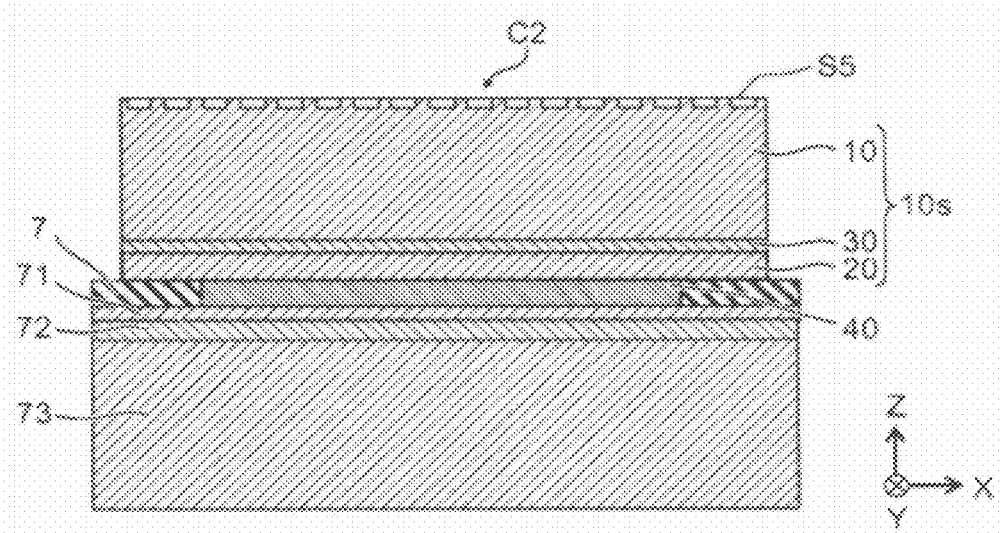

Next, as shown in FIG. 16A, for example, a stacked body 10s is patterned by using a lithography technique, and is divided for each of plural semiconductor light emitting devices. In this patterning, a cross-section of the stacked body 10s is formed into a tapered shape (mesa shape). That is, for example, a width along the X axis of the n-type semiconductor layer 10 is narrower than a width along the X axis of the p-type semiconductor layer 20. Further, for example, the width along the Y axis of the n-type semiconductor layer 10 is narrow than the width along the Y axis of the p-type semiconductor layer 20.

In this patterning, for example, the etching is stopped at the $SiO_2$ film of the interlayer insulating layer 7, and the interlayer insulating layer 7 is exposed.

A protection layer (not shown) is formed so as to cover a side face of the tapered stacked body 10s. For the protection layer, for example, the SiO2 film is used. Within the $SiO_2$ film, a portion covering a second major surface S2 of the n-type semiconductor layer 10 is removed. At this time, the $SiO_2$ film of a portion along an outer peripheral rim of the second major surface S2 of the n-type semiconductor layer 10 may be left. This allows the portion along the outer peripheral rim of the n-type semiconductor layer 10 to be protected by the protection layer.

Figure 16B:
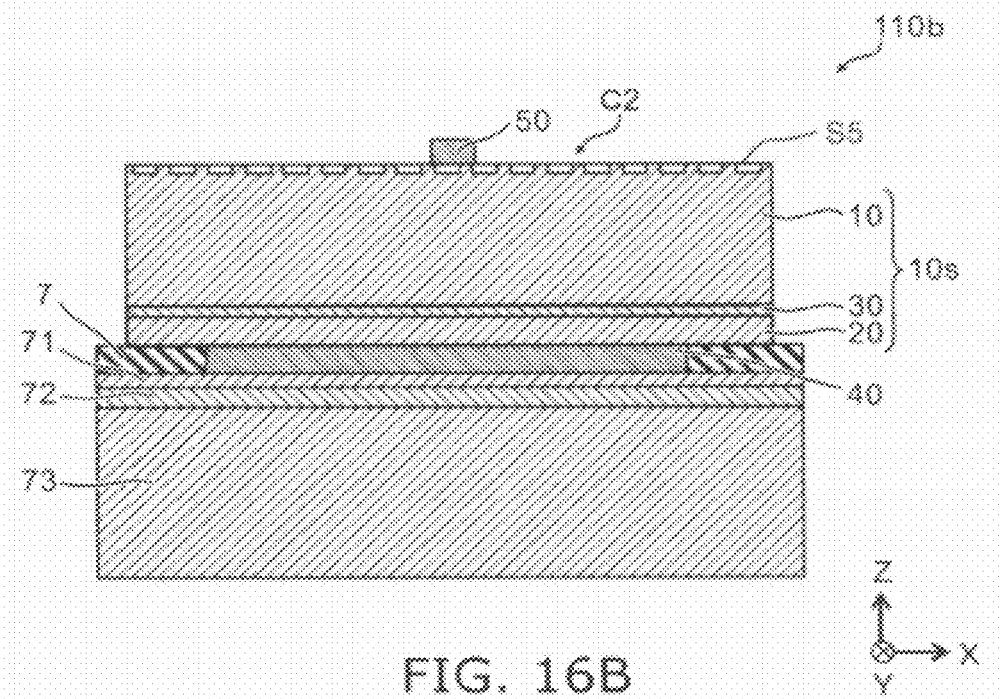

As shown in FIG. 16B, a portion except for the center of the second major surface S2 of the n-type semiconductor layer 10 is formed with the n-side electrode 50. For example, as the n-side electrode 50, a metallic film such as Ti, Al, Rh, In, Ni, Pt and Au is formed, and is processed into a predetermined shape.

In this manner, the n-side electrode 50 contains, for example, at least one element selected from the group consisting of Ti, Al, Rh, In, Ni, Pt, and Au.

Similarly to the embodiment, with a two stage etching applied to an epitaxial wafer wherein the first buffer layer 61b is patterned, a fine second concave-convex shape C2 is formed on the major surface S5 of the n-type semiconductor layer 10. This makes it possible to fabricate a structure having superior efficiency of light extraction from the major surface S5. Further, after the growth substrate 5 is removed, there is no need to form a fine concave-convex by lithography technique, nanoimprint technique, etc., and it is, therefore, possible to shorten the length of process.

In the second embodiment, though a device isolation process shown in FIG. 16A is performed after the first etching process and the second etching process, the device isolation process may be performed, for example, before and after the process of FIG. 13A or before and after the first etching of FIG. 14A. In that case, a layer for protecting the damages to an active layer due to an etching gas is provided as appropriate. Further, in the second embodiment, though the process including the patterning (step S201) of the buffer layer and the growth of the stacked body 10s is performed, the epitaxial wafer may be used wherein the buffer layer is patterned in advance and the stacked body 10s is formed thereon Third Embodiment FIGS. 22 to 24 are enlarged schematic cross-sectional views illustrating an embodiment.

Figure 22:
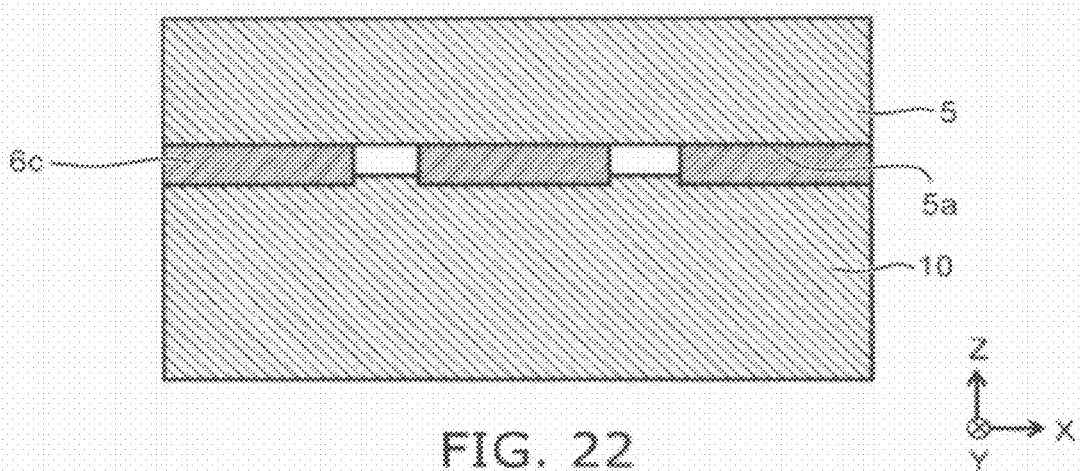
FIGS. 22 to 24 are enlarged schematic cross-sectional views illustrating an embodiment.
Figure 23:
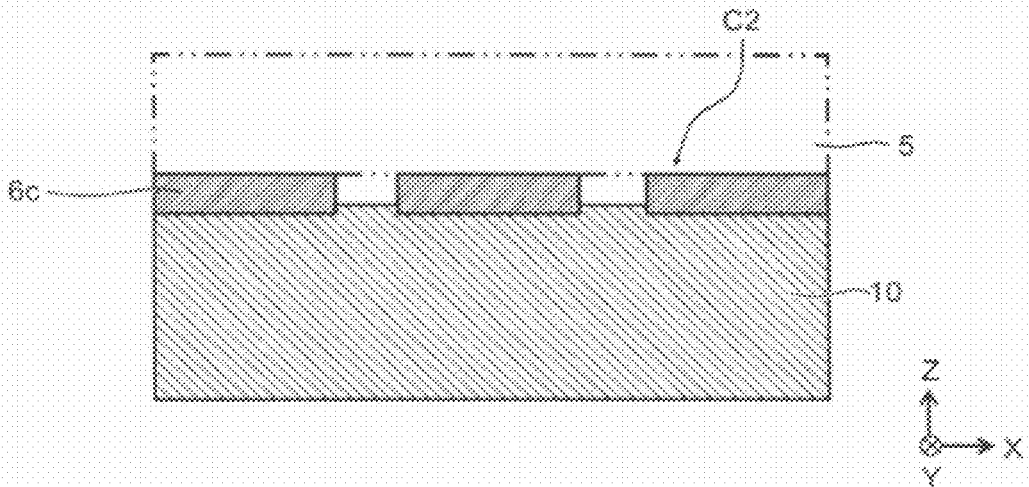
Figure 24:
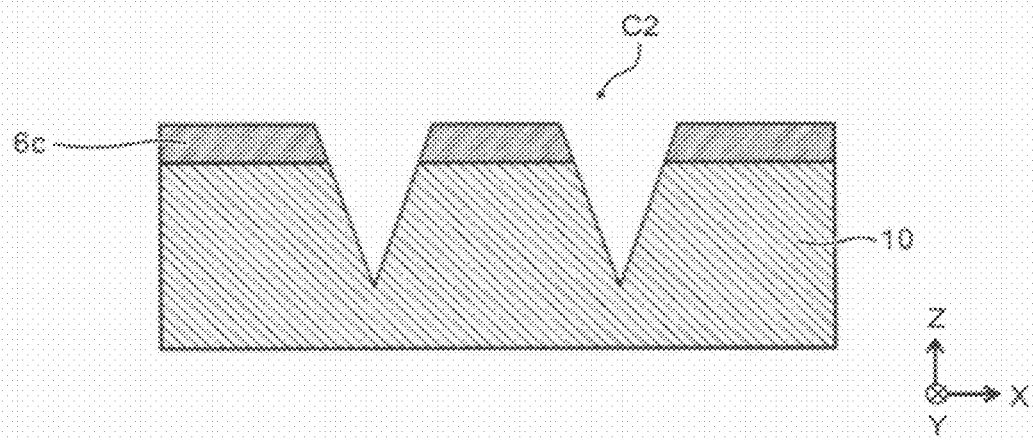

In FIGS. 22 to 24, an enlarged portion of a buffer layer is shown.

As shown in FIG. 22, in the embodiment, a buffer layer 6c is formed being divided into a plurality of regions. That is, the buffer layers 6c are provided on a major surface 5a of a growth substrate 5 at a predetermined interval.

For the buffer layer 6c, for example, AlN is used. The buffer layer 6c is divided into a plurality of regions by photolithography, etching, etc. after stacking, for example, an AlN layer on the major surface 5a of the growth substrate 5. One region of the buffer layer 6c is, for example, formed in the shape of hexagon. In the embodiment, the hexagonal regions of the buffer layer 6c are arranged at an interval of about 1 μm. Except for a portion wherein the buffer layer 6c is formed, the surface of the growth substrate 5 is exposed.

In this state, a stacked body 10s such as the n-type semiconductor layer 10 is formed on the buffer layer 6c. The n-type semiconductor layer 10 grown on the buffer layer 6c is grown not only in the upper direction but also in the lateral direction of the buffer layer 6c. When the buffer layer 6c is AlN and the growth substrate 5 is Si, probability of absorption and dissociation of the raw material molecule of GaN being the n-type semiconductor layer 10 is different between on AlN and on Si. Hence, the crystal growth of GaN is quickened on the AlN surface rather than on the Si surface. As a result, the n-type semiconductor layers 10 grown on adjacent buffer layers 6c respectively are bonded together during the growth to form an integrated film. Between the adjacent buffer layers 6c, there is formed a cavity region wherein the n-type semiconductor layer 10 is not grown.

After that, as shown in FIG. 23, the growth substrate 5 is removed (the first treatment process). For example, after grinding and removing the growth substrate 5 to some degree, the slightly remaining growth substrate 5 is removed, for example, by dry etching with an $SF_6$ gas used as an etchant. For the removal of the growth substrate 5, the first etching process may be applied. This brings about a state wherein the buffer layer 6c formed being divided into a plurality of regions remains on the second major surface S2 side of the n-type semiconductor layer 10. This buffer layer 6c exerts the same effect as that of the fine second concave-convex shape C2 shown in FIG. 12.

Further, from a state shown in FIG. 23, the second treatment process (for example, the second etching process) may be performed.

FIG. 24 is an enlarged schematic cross-sectional view illustrating a state wherein the second etching process is applied.

When the second etching process is applied from a state shown in FIG. 23, the n-type semiconductor layer 10 exposed from among the buffer layers 6c is etched. The n-type semiconductor layer 10 is etched along the plane direction, and for example, the cross-section is formed into a V shape. The buffer layer 6c is also etched into a tapered shape. Depending on a degree of the progress of the etching, the buffer layer 6c and the n-type semiconductor layer 10 that remain without being etched remain like a protrusion. Due to such shapes of the buffer layer 6c and the n-type semiconductor layer 10, the second major surface S2 of the n-type semiconductor layer 10 as illustrated in FIG. 7B exerts the same effect as that of the structure wherein surface roughening is performed.

As described above, according to the method for manufacturing the nitride semiconductor device according to the embodiment, a manufacturing yield can be improved.

In the specification of the application, "the nitride semiconductor" shall include semiconductors of all compositions wherein composition ratios x, y, and z are changed within respective ranges in the chemical formula: $B_xIn_yAl_zGa_{1-x-y-z}N$ ($0 \leq x \leq 1$, $0 \leq y \leq 1$, $0 \leq z \leq 1$, $x+y+z \leq 1$). Further, in the above chemical formula, the semiconductor further including a group V element other than N (nitrogen), the semiconductor further including various types of elements added so as to control various physical properties such as a conductivity type, and the semiconductor further including various types of elements unintentionally included shall be also included in "the nitride semiconductor".

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the embodiment, though an example using dry etching is shown for both processes as the first etching process and the second etching process, at least one of the first etching process and the second etching process may be performed by wet etching.

Further, in the embodiment, though a description is made on the semiconductor light emitting device as an example of the nitride semiconductor device, the nitride semiconductor device is not limited to the semiconductor light emitting device, but may be also applied to an electronic device such as a high electron mobility transistor (HEMT) and a photo diode.

Further, one skilled in the art may similarly practice the invention by appropriately selecting specific configurations of components such as electrodes, semiconductor layers, substrates, bonding layers, etc. from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a nitride semiconductor device, the method comprising:

removing a growth substrate of a structure body by using a buffer layer as an etching stop layer and dry etching with a first treatment material containing fluorine, the structure body having the growth substrate containing silicon, a buffer layer being a nitride containing aluminum and formed on a surface of the growth substrate, and a nitride semiconductor layer formed on the buffer layer unevenness not less than 2 micrometers being formed on a back face of the growth substrate by grinding the back face and reducing a thicknesses of the growth substrate after bonding a support substrate containing silicon to a side of the nitride semiconductor layer; and after the removing, forming a surface of the nitride semiconductor layer by removing the buffer layer and reducing a thickness of the nitride semiconductor layer using dry etching with a second treatment material containing chlorine, the unevenness being not transferred to the surface of the nitride semiconductor layer.

2. The method according to claim 1, wherein the first treatment material is an etchant having an etching rate with respect to the growth substrate higher than an etching rate with respect to the buffer layer.

3. The method according to claim 1, wherein the buffer layer is a nitride semiconductor.

4. The method according to claim 3, wherein the first treatment material contains sulfur.

5. The method according to claim 1, wherein the nitride semiconductor layer includes an n-type semiconductor layer, a p-type semiconductor layer, and a light emitting layer provided between the n-type semiconductor layer and the p-type semiconductor layer.

6. The method according to claim 4, wherein the second treatment material contains argon.

7. The method according to claim 5, the method further comprising forming unevenness on the n-type semiconductor layer.

8. The method according to claim 7, wherein the forming unevenness includes forming the unevenness by performing etching on the n-type semiconductor layer.

9. The method according to claim 1, wherein the nitride semiconductor layer includes a crystal formed by epitaxial crystal growth.

10. A method for manufacturing a nitride semiconductor device, the method comprising:

forming a film on a growth substrate containing silicon, the film being a portion of a buffer layer, the buffer layer being a nitride containing aluminum;

forming a first concave-convex shape by patterning the film;

forming the buffer layer on the film forming the first concave-convex shape by another portion of the buffer layer, a cavity being provided between another portion and the growth substrate;

forming a nitride semiconductor layer on the buffer layer;

bonding a support substrate to the nitride semiconductor layer;

removing the growth substrate by using dry etching with a first treatment material containing fluorine; and after removing the growth substrate, removing the buffer layer and reducing a thickness of the nitride semiconductor layer by using dry etching with a second treatment material containing chlorine different from the first treatment material to form a second concave-convex shape reflecting the first concave-convex shape in the nitride semiconductor layer.

11. The method according to claim 10, wherein the nitride semiconductor layer includes an n-type semiconductor layer, a p-type semiconductor layer, and a light emitting layer provided between the n-type semiconductor layer and the p-type semiconductor layer.

12. The method according to claim 10, wherein the nitride semiconductor layer is formed by crystal growth.

13. A method for manufacturing a nitride semiconductor device, the method comprising:

removing a growth substrate from a structure body by using a first treatment material after bonding a support substrate to an insulating layer and an electrode, the structure body having the growth substrate, a buffer layer forming a first concave-convex shape, the nitride semiconductor layer formed on the buffer layer, the insulating layer formed on a first portion of the nitride semiconductor layer, and the electrode formed on a second portion of the nitride semiconductor layer, a cavity region being provided between the growth substrate and the first concave-convex shape;

after removing the growth substrate, removing the buffer layer and reducing a thickness of the nitride semiconductor layer by using a second treatment material different from the first treatment material to form a second concave-convex shape reflecting the first concave-convex shape in the nitride semiconductor layer; and after forming the second concave-convex shape, patterning the nitride semiconductor layer as a mesa shape by using the insulating layer as an etching stop layer.

14. The method according to claim 10, wherein the first treatment material is an etchant having an etching rate with respect to the growth substrate higher than an etching rate with respect to the buffer layer.

15. The method according to claim 13, further comprising:
removing the growth substrate by etching; and
reducing thicknesses of the buffer layer and the nitride semiconductor layer by etching.

16. The method according to claim 15, wherein the first treatment material is an etchant having an etching rate with respect to the growth substrate higher than an etching rate with respect to the buffer layer.

17. The method according to claim 13, wherein the first treatment material contains fluorine, and the second treatment material contains chlorine.

18. The method according to claim 13, wherein the growth substrate includes silicon, and the buffer layer is a nitride containing aluminum.

19. The method according to claim 13, wherein the removing of the growth substrate includes removing the growth substrate by using dry etching.

* * * * *